(12) United States Patent
Shinagawa et al.

(10) Patent No.: US 6,608,326 B1
(45) Date of Patent: Aug. 19, 2003

(54) SEMICONDUCTOR FILM, LIQUID-CRYSTAL DISPLAY USING SEMICONDUCTOR FILM, AND METHOD OF MANUFACTURE THEREOF

(75) Inventors: Youmei Shinagawa, Mobara (JP); Akio Mimura, Hitachinaka (JP); Genshiro Kawachi, Mobara (JP); Takeshi Satoh, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/959,644

(22) PCT Filed: Jul. 11, 2000

(86) PCT No.: PCT/JP00/04608
§ 371 (c)(1),
(2), (4) Date: Nov. 2, 2001

(87) PCT Pub. No.: WO01/04939
PCT Pub. Date: Jan. 18, 2001

(30) Foreign Application Priority Data

Jul. 13, 1999 (JP) .................................... 11-198359

(51) Int. Cl.[7] .............................................. H01L 29/04
(52) U.S. Cl. ............................ 257/64; 257/65; 257/66; 257/69; 257/70; 257/347
(58) Field of Search .................................... 257/64–70

(56) References Cited

PUBLICATIONS

"High Performance Poly–Si TFTs Fabricated Using Pulsed Laser Annealing and Remote Plasma CVD with Low Temperature Processing" Kohno et al., IEEE Transactions on Electron Devices, vol. 42, No. 2, Feb. 1995, pp. 251–257.

"New Approach to Form poly–Si by Low, Wide Energy Range of Laser Irradiation" Hara et al., AM–LCD '97, pp. 59–62.

"Capillary Waves In Pulsed Excimer Laser Crystallized Amorphous Silicon" Fork et al., 1996 American Institute of Physics, pp. 2138–2140.

"Improvement of SPC poly–Si Film Using the ELA Method" Aya et al., AM–LCD '97, pp. 167–170.

Characteristics of Laser–Annealed Polycrystalline Silicon Films Mishima et al., The Institute of Electronics, Information and Communication Engineers, Technical Report of IEICE.EID98–19 (Jun. 1998), pp. 67–72.

*Primary Examiner*—Fetsum Abraham
(74) *Attorney, Agent, or Firm*—Antonelli, Terry, Stout & Kraus, LLP

(57) ABSTRACT

A crystalline semiconductor having an even surface and a large crystal grain size is formed on an economical glass substrate using a laser crystallizing technology. A series of processes, including forming an insulation film on a glass substrate; forming a semiconductor film in the first layer; crystallizing the semiconductor film in the first layer by irradiating laser light stepwise from weak energy laser light to strong energy laser light; forming a semiconductor film in a second layer having a film thickness thinner than that of the semiconductor film in the first layer; performing laser crystallization of the semiconductor thin film in the second layer by irradiating laser light stepwise from weak energy laser light to strong energy laser light, are continuously performed without exposing the workpiece to the atmosphere.

21 Claims, 16 Drawing Sheets

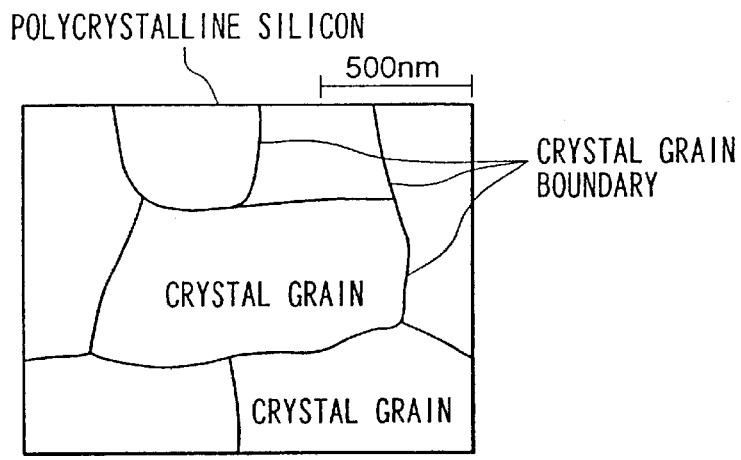
FIG. 1(A) PLAN VIEW
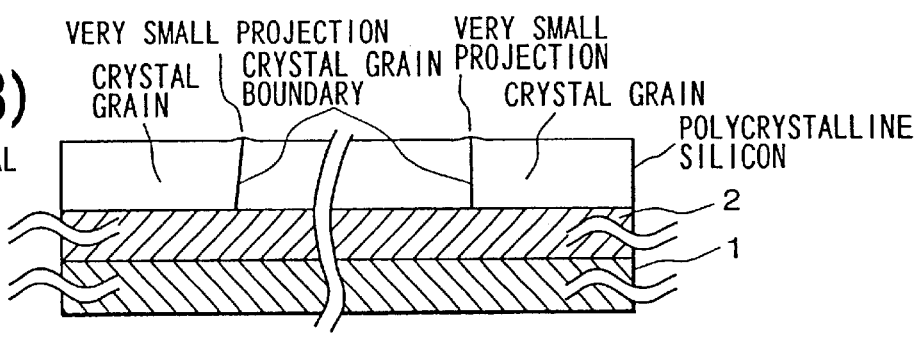
FIG. 1(B) SECTIONAL VIEW
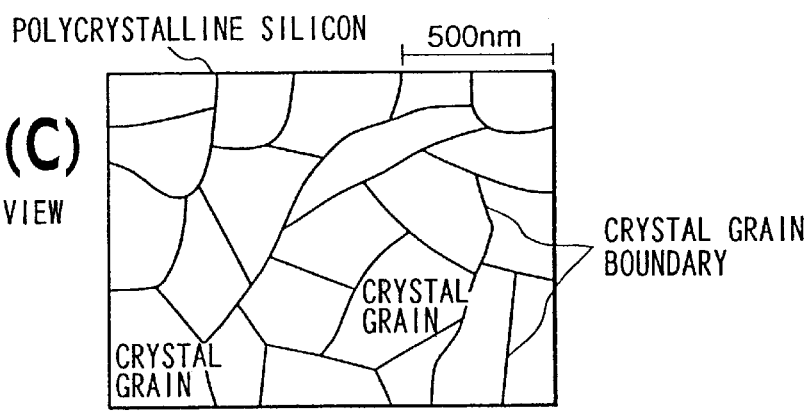
FIG. 1(C) PLAN VIEW
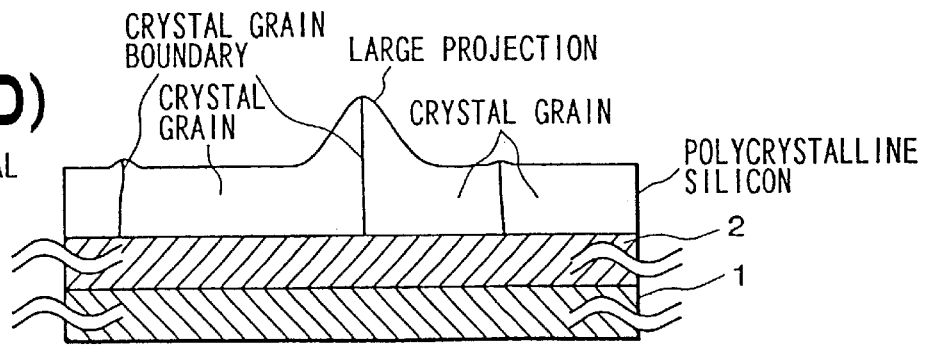
FIG. 1(D) SECTIONAL VIEW

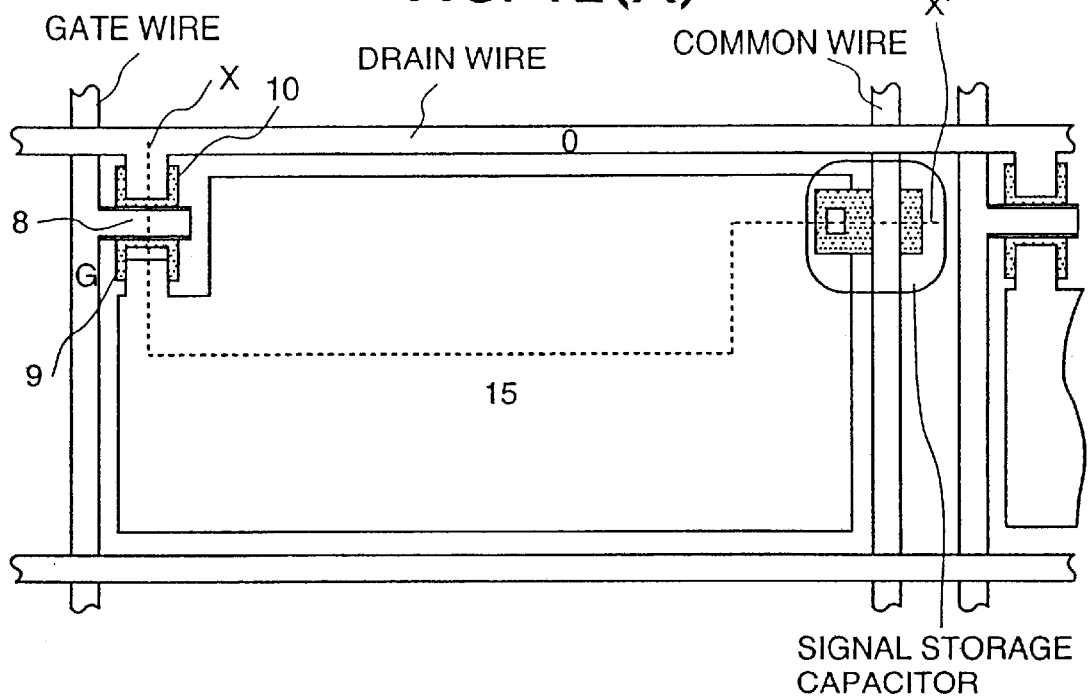
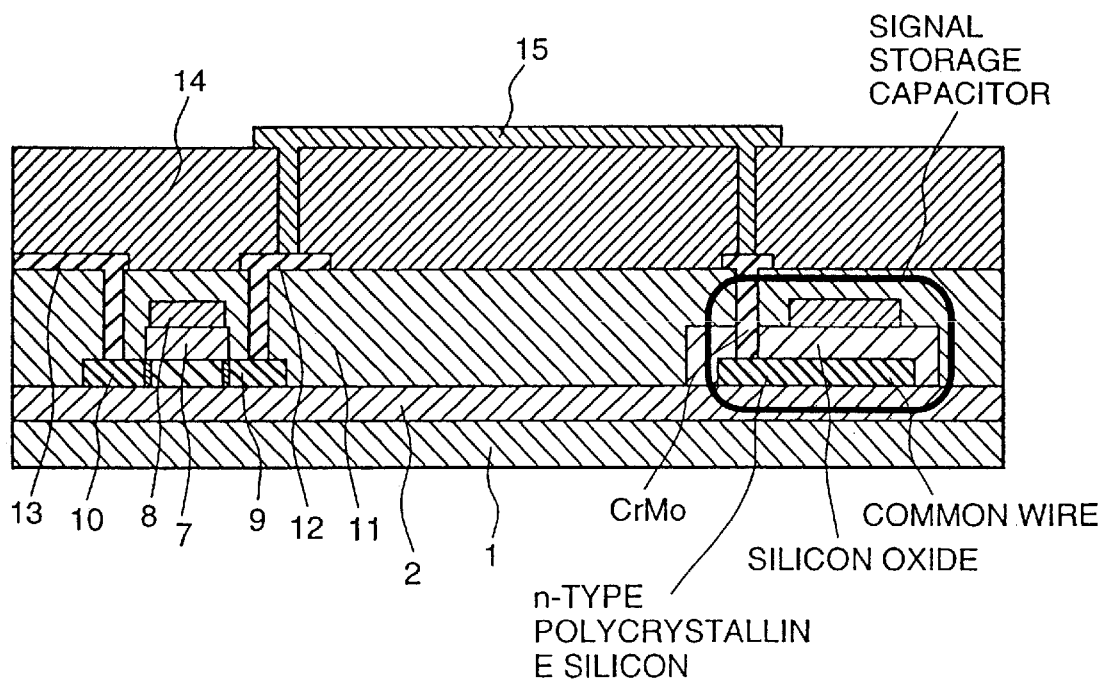

SEMICONDUCTOR FILM, LIQUID-CRYSTAL DISPLAY USING SEMICONDUCTOR FILM, AND METHOD OF MANUFACTURE THEREOF

BACKGROUND OF THE INVENTION

The present invention relates to a semiconductor thin film fabricated by a laser crystallizing method, and a thin film transistor and semiconductor devices such as a liquid crystal display apparatus, an active matrix type liquid crystal apparatus, a solar cell and the like which use the semiconductor thin film, and a method of fabricating the semiconductor thin film, the thin film transistor and the semiconductor devices.

The laser crystallizing technology is most widely studied as a means to fabricate a crystalline semiconductor with low cost, and the crystalline semiconductor is expected to be applied to a high performance thin film transistor, a high value-added liquid crystal display apparatus and a solar cell. Because the crystallization of the semiconductor thin film locally heats only the vicinity of the semiconductor surface by laser irradiation, a low-cost glass substrate and a low-cost organic resin substrate can be used for the supporting substrate and accordingly the laser crystallizing technology contributes to reduced cost. Since the laser-irradiated semiconductor is once liquefied and then solidified to be crystallized, a high-quality crystalline semiconductor having less defects can be obtained. One of means to improve the film quality of the crystalline semiconductor is to increase the crystal grain size. By increasing the crystal grain size, a volumetric ratio of the crystal grain boundary including defects to the whole semiconductor film is decreased and consequently the mobility of electrons and holes is improved. Further, decrease itself in number of the defects improves the quality of the crystalline semiconductor. In regard to the means to increase the crystal grain size, (1) Dig. Of Tech. Papers 1997 Int. Workshop Active Matrix Liquid Crystal Display (Business Center of Academic Societies, Tokyo 1997 ), p59 proposes a method that after crystallizing an amorphous silicon by laser irradiation, an amorphous silicon film is formed on the fabricated polycrystalline silicon and then the amorphous silicon is crystallized by laser irradiation.

On the other hand, a problem of the crystalline semiconductor, for example, the polycrystalline silicon fabricated by the laser crystallizing method is forming of an uneven surface due to many projections which are produced when a high-quality polycrystalline silicon having large crystal grain size is fabricated. The height of the projection is nearly equal to the film thickness of the semiconductor before irradiating the laser light. The mechanism of producing the projection is considered, as described in Applied Physics Letters, Vol.68, No.15, 1996, p2138, that the projection is formed by volumetric expansion caused by the phase transition from the melted silicon to the solid silicon at a boundary where surfaces of crystal growth in a direction lateral to the substrate surface collide with each other. The crystal growth in the lateral direction generally occurs when a crystal having a crystal grain size larger than the thickness of the semiconductor thin film is formed. When a semiconductor thin film having large unevenness is used to the active layer of a copalanar type thin film transistor, concentration of electric field occurs in the projection to cause dielectric breakdown in the gate insulation film as the upper layer of the active layer or to cause reduction of the reliability of the gate insulation film such production of defects due to hot carrier. In order to protect these problems, the thickness of the gate insulation film needs to be formed to be thicker than 100 nm and consequently it becomes difficult to drive the thin film transistor with low power consumption. Further, since the crystallinity of the projection is very low and the projection is located in a channel area when the semiconductor having many projections produced is used for a copalanar type or a normal stagger type thin film transistor, the ON current is reduced. In regard to means for suppressing occurrence of the projections when the semiconductor thin film is crystallized with laser light, the following means are reported.

(2) A method of irradiating laser light in stages with a pitch of 10 mJ/cm$^2$ is described in IEEE TRANSACTIONS ON ELECTRON DEVICES, Vol.42, No.2, 1995, p251.

(3) A method of irradiating laser light after poly-crystallizing amorphous silicon a solid phase growth method is described in Dig. of Tech. Papers 1997, Int. Workshop Active Matrix Liquid Crystal Displays (Business Center of Academic Societies, Tokyo 1997 ) p167.

(4) A method of changing a shape of laser beam so as to have a wide lower slopes is described in Shin-etsu Chemical Technical Report EID98-19 (1998-06) p67.

The above-described conventional technology (1) intending to increase crystal brain size of the crystalline semiconductor has a problem in that the crystal grain size can be certainly increased, but projections having a height nearly equal to the film thickness of the semiconductor are produced and accordingly large unevenness is produced. Further, there is another problem in that because the amorphous silicon before laser irradiation is exposed to atmosphere in order to perform dehydrogenation and thereby a natural oxide film is formed on the surface, oxygen enters into the silicon film when it is crystallized by laser light to reduce the quality of the film.

On the other hand, the conventional technology (2) for suppressing production of the projections has a problem in that since laser light is irradiated in stages with a small pitch of 10 mJ/cm$^2$ pitch and fine crystalline silicon once formed is difficult to be melted, what can be fabricated is only polycrystalline silicon having a crystal grain size of nearly 60 nm and accordingly polycrystalline silicon having a large crystal grain size above 500 nm can not be fabricated. The conventional technology (3) for suppressing production of the projections has a problem in that because the solid phase growth method is used and consequently the silicon is heated at 1000° C., the economical glass substrate can not be used and accordingly the crystalline semiconductor can not be fabricated with low cost. The conventional technology (4) for suppressing production of the projections has a problem in that since the crystal grain size becomes small as the projection is made small, the small roughness and the large crystal grain size can not be compatible with each other.

SUMMARY OF THE INVENTION

An object of the present invention is to make increase of the crystal grain size and suppression of projection forming on the semiconductor surface compatible with each other.

Another object of the present invention is to provide a flat and high-performance crystalline semiconductor in low cost which has a film thickness above 5 nm, an average crystal grain size above 500 nm and an average surface roughness below 5 nm.

In order to solve the above-mentioned problems, the 1st invention in accordance with the present invention is a semiconductor thin film which is characterized by that the semiconductor thin film is formed on a glass substrate by a laser crystallizing method, and has a film thickness within a range of 40 nm to 100 nm; an average roughness of the surface smaller than 5 nm; and an average size of the crystal grains larger than 500 nm.

The 2nd invention in accordance with the present invention is a semiconductor thin film which is characterized by that the semiconductor thin film is formed on a glass substrate by a laser crystallizing method, and has a film thickness within a range of 40 nm to 100 nm; an average roughness of the surface smaller than 5 nm; and an average size of the crystal grains larger than 500 nm, wherein when a surface area of an arbitrary crystal grain is expressed by Sn and a circumferential length on the surface of the arbitrary crystal grain is expressed by Ln, at least more than 50% of the crystal grains satisfy the relation $Ln \leq 4\pi Rn$ where $Rn=(Sn/\pi)^{1/2}$.

The 3rd invention in accordance with the present invention is a semiconductor thin film which is characterized by that the semiconductor thin film is formed on a glass substrate by a laser crystallizing method, and has a film thickness within a range of 40 nm to 100 nm; an average roughness of the surface smaller than 5 nm; and an average size of the crystal grains larger than 500 nm, wherein when a surface area of an arbitrary crystal grain is expressed by Sn and a circumferential length on the surface of the arbitrary crystal grain is expressed by Ln, at least more than 50% of the crystal grains satisfy the relation $Ln \leq 4\pi Rn$ where $Rn=(Sn/\pi)^{1/2}$, and further when crystal structures on an arbitrary cross section of the crystalline semiconductor thin film are observed, at least more than 70% of the crystal grains continuously extend from an interface between the semiconductor layer and a base layer to the semiconductor surface without discontinuity at some midpoint.

The 4th invention in accordance with the present invention is a semiconductor thin film which is characterized by that the semiconductor thin film is formed on a glass substrate by a laser crystallizing method, and has a film thickness thicker than 40 nm; an average roughness of the surface smaller than 5 nm; and an average size of the crystal grains larger than 500 nm.

The 5th invention in accordance with the present invention is a semiconductor thin film which is characterized by that the semiconductor thin film is formed on a glass substrate by a laser crystallizing method, and has a film thickness thicker than 40 nm; an average roughness of the surface smaller than 5 nm; and an average size of the crystal grains larger than 500 nm, wherein when a surface area of an arbitrary crystal grain is expressed by Sn and a circumferential length on the surface of the arbitrary crystal grain is expressed by Ln, at least more than 50% of the crystal grains satisfy the relation $Ln \leq 4\pi Rn$ where $Rn=(Sn/\pi)^{1/2}$.

In addition to the characteristic of the semiconductor thin film of the 1st, the 2nd, the 3rd, the 4th or the 5th invention, the 6th invention in accordance with the present invention is a semiconductor thin film which is characterized by that orientation of the semiconductor thin film is mainly (1.1.1) plane.

In addition to the characteristic of the semiconductor thin film of the 1st, the 2nd, the 3rd, the 4th, the 5th or the 6th invention, the 7th invention in accordance with the present invention is a semiconductor thin film which is characterized by that the semiconductor is silicon.

In addition to the characteristic of the semiconductor thin film of the 1st, the 2nd, the 3rd, the 4th, the 5th, the 6th or the 7th invention, the 8th invention in accordance with the present invention is a semiconductor thin film which is characterized by that at least a part of crystal grain boundaries are positioned, and orientation of the part of crystal grains is mainly (1.0.0) plane or (1.1.0).

In addition to the characteristic of the semiconductor thin film of the 1st, the 2nd, the 3rd, the 4th, the 5th, the 6th, the 7th or 8th invention, the 9th invention in accordance with the present invention is a semiconductor thin film which is characterized by that the glass substrate is made of a no-alkali glass which has a softening point lower than 700° C.

The 10th invention in accordance with the present invention is a method of fabricating a semiconductor thin film which is characterized by that the method of fabricating a semiconductor thin film comprises the steps of forming an insulation film on a glass substrate; forming a semiconductor thin film on the insulation film; and continuously following the semiconductor thin film forming, crystallizing the formed semiconductor thin film by irradiating laser light without exposing to atmosphere, wherein the set of forming the semiconductor thin film and crystallizing the semiconductor thin film by irradiating laser light is repeated at least two times, and a method of irradiating laser light in each of the sets is that energy of the laser light is increased in steps from scanning of weak energy laser light to scanning of strong energy laser light.

The 11th invention in accordance with the present invention is a method of fabricating a semiconductor thin film which is characterized by that the method of fabricating a semiconductor thin film comprises the steps of forming an insulation film on a glass substrate; forming a semiconductor thin film on the insulation film; and continuously following the semiconductor thin film forming, crystallizing the formed semiconductor thin film by irradiating laser light without exposing to atmosphere, wherein the set of forming the semiconductor thin film and crystallizing the semiconductor thin film by irradiating laser light is repeated at least two times, and thickness of the film in an upper layer at semiconductor film forming is thinner than thickness of the film in a lower layer.

In addition to the characteristic of the fabricating method of the 10th or the 11th invention, the 12th invention in accordance with the present invention is a method of fabricating a semiconductor thin film which is characterized by that the film thickness of the semiconductor thin film formed in the first layer is within a range of 30 nm to 70 nm, and the film thickness of the semiconductor thin film formed in the second layer is within a range of 25 nm to 40 nm.

In addition to the characteristic of the fabricating method of the 10th, the 11th or the 12th invention, the 13th invention in accordance with the present invention is a method of fabricating a semiconductor thin film which is characterized by that the formed semiconductor thin film is silicon having a concentration of combined hydrogen in the film less than 10%.

In addition to the characteristic of the fabricating method of the 10th, the 11th, the 12th or the 13th invention, the 14th invention in accordance with the present invention is a method of fabricating a semiconductor thin film which is characterized by that temperature of the substrate during the laser crystallization is within a range of 200° C. to 500° C.

In addition to the characteristic of the fabricating method of the 10th, the 11th, the 12th, the 13th or the 14th invention, the 15th invention in accordance with the present invention is a method of fabricating a semiconductor thin film which is characterized by that the glass substrate used is a no-alkali glass and has a softening point lower than 700° C.

The 16th invention in accordance with the present invention is a semiconductor apparatus containing a thin film transistor which is characterized by that the thin film transistor is formed on a glass substrate, and a semiconductor thin film formed in an active layer of the thin film transistor through a laser crystallizing method has a thickness within a range of 40 nm to 100 nm; an average roughness of the surface smaller than 5 nm; and an average size of the crystal grains larger than 500 nm.

The 17th invention in accordance with the present invention is a semiconductor apparatus containing a thin film transistor which is characterized by that the thin film transistor is formed on a glass substrate, and a semiconductor thin film formed in an active layer of the thin film transistor through a laser crystallizing method has a thickness within a range of 40 nm to 100 nm; an average roughness of the surface smaller than 5 nm; and an average size of the crystal grains larger than 500 nm, wherein when a surface area of an arbitrary crystal grain is expressed by Sn and a circumferential length on the surface of the arbitrary crystal grain is expressed by Ln, at least more than 50% of the crystal grains satisfy the relation $Ln \leq 4\pi Rn$ where $Rn=(Sn/\pi)^{1/2}$.

The 18th invention in accordance with the present invention is a semiconductor apparatus containing a thin film transistor which is characterized by that the thin film transistor is formed on a glass substrate, and a semiconductor thin film formed in an active layer of the thin film transistor through a laser crystallizing method has a thickness within a range of 40 nm to 100 nm; an average roughness of the surface smaller than 5 nm; and an average size of the crystal grains larger than 500 nm, wherein when a surface area of an arbitrary crystal grain is expressed by Sn and a circumferential length on the surface of the arbitrary crystal grain is expressed by Ln, at least more than 50% of the crystal grains satisfy the relation $Ln \leq 4\pi Rn$ where $Rn=(Sn/\pi)^{1/2}$, and further when crystal structures on an arbitrary cross section of the crystalline semiconductor thin film are observed, at least more than 70% of the crystal grains continuously extend from an interface between the semiconductor layer and a base layer to the semiconductor surface without discontinuity at some midpoint.

The 19th invention in accordance with the present invention is a semiconductor apparatus containing a thin film transistor which is characterized by that the thin film transistor is formed on a glass substrate, and the semiconductor thin film of the 4th, the 5th, the 6th, the 7th, the 8th or the 9th invention is used in an active layer of the thin film transistor.

The 20th invention in accordance with the present invention is a semiconductor apparatus containing a copalanar type or a normal stagger type thin film transistor which is characterized by that the thin film transistor is formed on a glass substrate, and the semiconductor thin film of the 1st, the 2nd, the 3rd, the 4th, the 5th, the 6th, the 7th, the 8th or the 9th invention is used in an active layer of the thin film transistor, and a film thickness of a gate insulation film of the thin film transistor is thinner than 80 nm or a ratio of the film thickness of the gate insulation film to a film thickness of the active layer is smaller than 8/6.

The 21st invention in accordance with the present invention is a semiconductor apparatus containing a copalanar type or a normal stagger type thin film transistor which is characterized by that the thin film transistor is formed on a glass substrate, and the semiconductor thin film of the 1st, the 2nd, the 3rd, the 4th, the 5th, the 6th, the 7th, the 8th or the 9th invention is used in an active layer of the thin film transistor, and a film thickness of a gate insulation film of the thin film transistor is thinner than a film thickness of the active layer.

In addition to the characteristic of the semiconductor apparatus of the 16th, the 17th, the 18th, the 19th the 20th or the 21st invention, the 22nd invention in accordance with the present invention is a semiconductor apparatus containing a thin film transistor which is characterized by that the glass substrate is made of a no-alkali glass which has a softening point lower than 700° C.

The 23rd invention in accordance with the present invention is a semiconductor apparatus containing a solar cell which is characterized by that a semiconductor thin film formed at least in a first layer in semiconductor layers of the solar cell through a laser crystallizing method has a thickness thicker than 40 nm; an average roughness of the surface smaller than 5 nm; and an average size of the crystal grains larger than 500 nm.

The 24th invention in accordance with the present invention is a semiconductor apparatus containing a solar cell which is characterized by that a semiconductor thin film formed at least in a first layer in semiconductor layers of the solar cell through a laser crystallizing method has a thickness thicker than 40 nm; an average roughness of the surface smaller than 5 nm; and an average size of the crystal grains larger than 500 nm, wherein when a surface area of an arbitrary crystal grain is expressed by Sn and a circumferential length on the surface of the arbitrary crystal grain is expressed by Ln, at least more than 50% of the crystal grains satisfy the relation $Ln \leq 4\pi Rn$ where $Rn=(Sn/\pi)^{1/2}$.

The 25th invention in accordance with the present invention is a semiconductor apparatus containing a solar cell which is characterized by that a semiconductor thin film formed at least in a first layer in semiconductor layers of the solar cell through a laser crystallizing method has a thickness thicker than 40 nm; an average roughness of the surface smaller than 5 nm; and an average size of the crystal grains larger than 500 nm, wherein when a surface area of an arbitrary crystal grain is expressed by Sn and a circumferential length on the surface of the arbitrary crystal grain is expressed by Ln, at least more than 50% of the crystal grains satisfy the relation $Ln \leq 4\pi Rn$ where $Rn=(Sn/\pi)^{1/2}$, and further when crystal structures on an arbitrary cross section of the crystalline semiconductor thin film are observed, at least more than 70% of the crystal grains continuously extend from an interface between the semiconductor layer and a base layer to the semiconductor surface without discontinuity at some midpoint.

The 26th invention in accordance with the present invention is a semiconductor apparatus containing a solar cell which is characterized by that the semiconductor thin film of the 1st, the 2nd, the 3rd, the 6th, the 7th, the 8th or the 9th invention is used at least in a first layer in semiconductor layers of the solar cell.

The 27th invention in accordance with the present invention is a method of fabricating a semiconductor apparatus containing a thin film transistor which is characterized by that the method of fabricating the semiconductor thin film of the 10th, the 11th, the 12th, the 13th, the 14th or the 15th invention is applied to fabrication of an active layer of the thin film transistor.

The 28th invention in accordance with the present invention is a method of fabricating a semiconductor apparatus containing a solar cell which is characterized by that the method of fabricating the semiconductor thin film of the 10th, the 11th, the 12th, the 13th, the 14th or the 15th invention is applied to fabrication of at least a first layer in semiconductor layers of the solar cell.

The 29th invention in accordance with the present invention is a semiconductor apparatus containing an active matrix type liquid crystal display apparatus in which a thin film transistor is used as a drive element in a pixel or a peripheral circuit, wherein the semiconductor apparatus is characterized by that a no-alkali glass having a softening point lower than 700° C. is used for a supporting substrate, and the thin film transistor of the 16th, the 17th, the 18th, the 19th, the 20th, the 21st or the 22nd invention is used for the drive element in the pixel or the peripheral circuit of the active matrix type liquid crystal display apparatus.

The 30th invention in accordance with the present invention is a method of fabricating a semiconductor apparatus containing an active matrix type liquid crystal display apparatus in which a thin film transistor is used as a drive element in a pixel or a peripheral circuit, wherein the method is characterized by that a no-alkali glass having a softening point lower than 700° C. is used for a supporting substrate, and the method of fabricating a thin film transistor of the 27th invention is applied to fabrication of the thin film transistor of the active matrix type liquid crystal display apparatus.

The 31st invention in accordance with the present invention is a semiconductor apparatus containing an active matrix type liquid crystal display apparatus in which a thin film transistor is used as a drive element in a pixel and one of electrodes of a signal storage capacitor in the pixel is formed of a semiconductor thin film in the same layer as an active layer of the thin film transistor, wherein the semiconductor apparatus is characterized by that a no-alkali glass having a softening point lower than 700° C. is used for a supporting substrate, and the semiconductor thin film forming the one of electrodes of a signal storage capacitor in the pixel of the active matrix type liquid crystal display apparatus has a film thickness within a range of 40 nm to 100 nm; an average roughness of the surface smaller than 5 nm; and an average size of the crystal grains larger than 500 nm.

The 32nd invention in accordance with the present invention is a semiconductor apparatus containing an active matrix type liquid crystal display apparatus in which a thin film transistor is used as a drive element in a pixel and one of electrodes of a signal storage capacitor in the pixel is formed of a semiconductor thin film in the same layer as an active layer of the thin film transistor, wherein the semiconductor apparatus is characterized by that a no-alkali glass having a softening point lower than 700° C. is used for a supporting substrate, and the semiconductor thin film forming the one of electrodes of the signal storage capacitor in the pixel of the active matrix type liquid crystal display apparatus has a film thickness within a range of 40 nm to 100 nm; an average roughness of the surface smaller than 5 nm; and an average size of the crystal grains larger than 500 nm, wherein when a surface area of an arbitrary crystal grain is expressed by Sn and a circumferential length on the surface of the arbitrary crystal grain is expressed by Ln, at least more than 50% of the crystal grains satisfy the relation $Ln \leq 4\pi Rn$ where $Rn=(Sn/\pi)^{1/2}$.

The 33rd invention in accordance with the present invention is a semiconductor apparatus containing an active matrix type liquid crystal display apparatus in which a thin film transistor is used as a drive element in a pixel and one of electrodes of a signal storage capacitor in the pixel is formed of a semiconductor thin film in the same layer as an active layer of the thin film transistor, wherein the semiconductor apparatus is characterized by that a no-alkali glass having a softening point lower than 700° C. is used for a supporting substrate, and the semiconductor thin film forming the one of electrodes of the signal storage capacitor in the pixel of the active matrix type liquid crystal display apparatus has a film thickness within a range of 40 nm to 100 nm; an average roughness of the surface smaller than 5 nm; and an average size of the crystal grains larger than 500 nm, wherein when a surface area of an arbitrary crystal grain is expressed by Sn and a circumferential length on the surface of the arbitrary crystal grain is expressed by Ln, at least more than 50% of the crystal grains satisfy the relation $Ln \leq 4\pi Rn$ where $Rn=(Sn/\pi)^{1/2}$, and further when crystal structures on an arbitrary cross section of the crystalline semiconductor thin film are observed, at least more than 70% of the crystal grains continuously extend from an interface between the semiconductor layer and a base layer to the semiconductor surface without discontinuity at some midpoint.

The 34th invention in accordance with the present invention is a semiconductor apparatus containing an active matrix type liquid crystal display apparatus in which a thin film transistor is used as a drive element in a pixel and one of electrodes of a signal storage capacitor in the pixel is formed of a semiconductor thin film in the same layer as an active layer of the thin film transistor, wherein the semiconductor apparatus is characterized by that a no-alkali glass having a softening point lower than 700° C. is used for a supporting substrate, and the semiconductor thin film forming the one of electrodes of the signal storage capacitor in the pixel is the semiconductor thin film of the 4th, the 5th, the 6th, the 7th, the 8th or the 9th invention.

The 35th invention in accordance with the present invention is a method of fabricating a semiconductor apparatus containing an active matrix type liquid crystal display apparatus in which a thin film transistor is used as a drive element in a pixel and one of electrodes of a signal storage capacitor in the pixel is formed of a semiconductor thin film in the same layer as an active layer of the thin film transistor, wherein the method is characterized by that a no-alkali glass having a softening point lower than 700° C. is used for a supporting substrate, and the method of fabricating the semiconductor thin film of the 10th, the 11th, the 12th, the 13th, the 14th or the 15th invention is applied to fabrication of the semiconductor thin film forming the one of electrodes of the signal storage capacitor in the pixel.

The 36th invention in accordance with the present invention is a method of fabricating a semiconductor thin film or a semiconductor apparatus of the 10th, the 11th, the 12th, the 13th, the 14th, the 15th, the 27th, the 28th, the 29th, the 30th or the 35th, wherein the method is characterized by that the semiconductor thin film or the semiconductor apparatus is fabricated using an apparatus in which at least a film forming apparatus for forming a semiconductor thin film and a laser crystallizing apparatus are connected to each other by a transfer apparatus having an evacuating apparatus.

In addition to the characteristic of the method of fabricating the semiconductor thin film or the semiconductor apparatus of the 10th, the 11th, the 12th, the 13th, the 14th, the 15th, the 27th, the 28th the 29th, the 30th or 35th invention, the 37th invention in accordance with the present invention is a method of fabricating a semiconductor thin film or a semiconductor apparatus which is characterized by that the semiconductor thin film or the semiconductor apparatus is fabricated using an apparatus in which at least a film forming apparatus for forming a semiconductor thin film, a film forming apparatus for forming an insulation film and a laser crystallizing apparatus are connected to each other by transfer apparatuses each having an evacuating apparatus.

In addition to the characteristic of the 36th or the 37th invention, The 38th invention in accordance with the present invention is a method of fabricating a semiconductor thin film or a semiconductor apparatus which is characterized by that the atmosphere of the transfer apparatus is maintained in a vacuum below $10^{-5}$ torr or an atmosphere of an inert gas such as nitrogen, helium, neon, argon or the like.

In addition to the characteristic of the 10th, the 11th, the 12th, the 13th, the 14th, the 15th, the 27th, the 28th, the 29th, the 30th or the 35th invention, the 39th invention in accordance with the present invention is a method of fabricating a semiconductor thin film or a semiconductor apparatus which is characterized by that the semiconductor thin film or the semiconductor apparatus is fabricated using an in-line type apparatus in which at least a film forming portion for forming a semiconductor thin film, a laser crystallizing portion and a transfer portion are placed in a single chamber.

BRIEF DESCRIPTION OF DRAWINGS

FIG. 1 is views explaining the sectional structure and the plane structure of a polycrystalline silicon thin film fabricated through the present invention.

FIG. 12 is views showing the plane structure and the sectional structure of a pixel in an active matrix type liquid crystal display apparatus in which the polycrystalline silicon in accordance with the present invention is used to an electrode in one side of a signal accumulating capacitor in the pixel.

DESCRIPTION OF THE PREFERRED EMBODIMENTS

Embodiments of the present invention will be described below, referring to the accompanied drawings.

Initially, a first embodiment in which the present invention is applied to fabrication of a polycrystalline silicon thin film will be described below, referring to the accompanied drawings. FIGS. 1A and B are a plan view and a sectional view showing the crystal structure of polycrystalline silicon formed on a glass substrate 1 and a lower base insulation film 2 through a method of the present invention. FIGS. 1C and D are a plan view and a sectional view showing the crystal structure of polycrystalline silicon having an average crystal grain size of 210 nm fabricated through a conventional laser crystallization method. The film thickness of the both polycrystalline silicon is 60 nm. It can be understood from the plane structure of the polycrystalline silicon in accordance with the present invention shown in FIG. 1A that the average crystal grain size is as large as 530 nm, and from the cross-sectional view of FIG. 1B that projections are hardly produced in the crystal grain boundaries. On the other hand, in the polycrystalline silicon according to the conventional fabrication method, a projection having a level of height equal to the thickness of the film is produced in the crystal grain boundary. In the present invention, the size of a crystal grain is defined as the size of a pattern of which the periphery is surrounded by etched grain boundaries appearing when the surface of the polycrystalline silicon is treated with SECCO etching solution to selectively etching the crystal grain boundaries. This pattern can be observed using an analysis means such as a scanning electron microscope (SEM), an atomic force microscope (AFM), a scanning tunneling microscope (STM) or the like. Further, the grain size of each crystal grain is defined by a diameter of a circle having an area equal to an area of the each crystal grain, and the average crystal grain size $1a$ of an arbitrary region (the area is S) containing m crystal grains is defined the following equation. In the present invention, in a case of using a SEM, the area S of the region to obtain an average crystal grain size is defined as the sum of areas of crystal grains each of which is photographed in a magnification capable of checking the size of crystal grain and each of which is photographed so that the whole grain boundary falls within a field of view without being cut out of the field of view. In a case where there are a plurality of fields of view, the area S of the region is defined as the total sum of the sums of areas of crystal grains each of which falls within the individual field of view in the whole grain. In a case of using an AFM or a STM, the area S of the region is defined as the sum of areas of crystal grains each whole grain boundary of which falls within the arbitrary measuring field.

$$1a = 2 \times ((S/m)/\pi)^{1/2}$$

Figure 2:
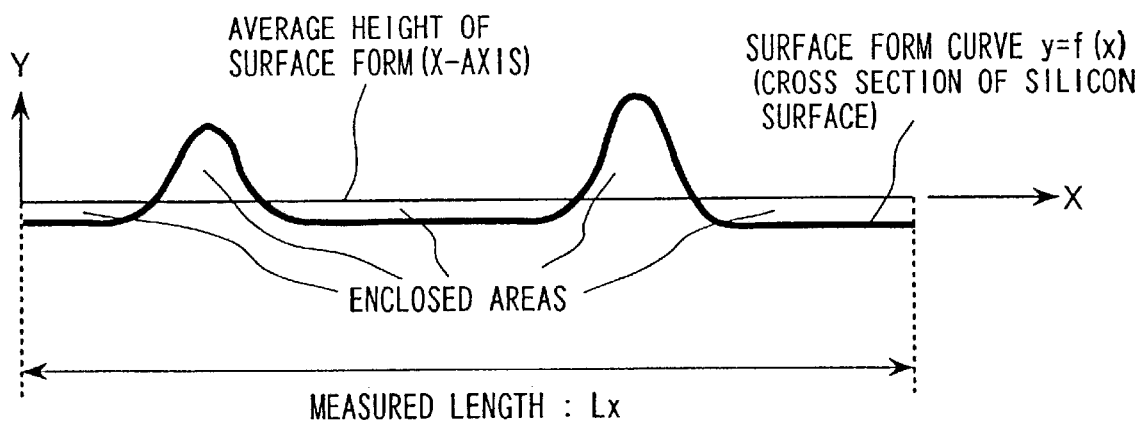
FIG. 2 is a view explaining a method of calculating an average roughness of a surface when the surface form is analyzed by a two-dimensional sectional structure.

In the present invention, the shape of each crystal grain is irregular because the polycrystalline silicon is formed by laser crystallization. However, since the polycrystalline silicon isotropically grows from a generated crystal seed in a direction parallel to the substrate when the melted silicon is crystallized, the shape of the polycrystalline silicon crystal does not become a complex dendrite which can be observed in polycrystalline silicon formed through a solid phase growth method. From observation of crystal grains after treating a surface of the polycrystalline silicon with SECCO etching solution, it was found that in the polycrystalline silicon in accordance with the present invention, at least more than 50% of the crystal grains satisfied the relation $Ln \leq 4\pi Rn$. Therein, $Rn=(Sn/\pi)^{1/2}$, Sn is a surface area of an arbitrary crystal grain, and Ln is a circumferential length on the surface of the arbitrary crystal grain. From the above relation holding, it can be understood that the volume of crystal grain boundary of the polycrystalline silicon in accordance with the present invention is smaller than that of the polycrystalline silicon film prepared through a solid phase growth and composed of crystal grains for which the above relation does generally not hold, and that the polycrystalline silicon in accordance with the present invention is a high-quality crystalline semiconductor having a small defect density per the whole silicon film. Further, from observation of a cross section of polycrystalline silicon in accordance with the present invention using a transmission electron microscope (TEM), it was found that more than 70% of all the crystal grains continuously extended from an interface between the semiconductor layer and a base layer to the semiconductor surface without discontinuity at some midpoint. Because there are few regions in the film where plural crystal grains are stacked up in the direction of film thickness, the polycrystalline silicon in accordance with the present invention is a high-quality polycrystalline silicon having less defects caused by crystal grains extending in the lateral direction of the substrate. It was found from measurement the surface of the semiconductor film using a atomic force microscope (AFM) that the average roughness of the surface was 2 nm. Therein, the average roughness of the surface in the present invention means an arithmetic average roughness (Ra), and in a case of three-dimensionally analyzing the surface form of the semiconductor, the average roughness of the surface is a value of dividing a volume of a portion surrounded by a quadric surface of the surface form and a plane in the average level of the surface form by the measured area. In the present invention, when an analyzing means capable of three-dimensionally analyzing the surface form such as an AFM, a scanning tunneling electron microscope (STM) or the like is used for analyzing a measured area, the measured area is an arbitrary region of the semiconductor surface having an area larger than an analysis limit area which is analyzable by the analyzing means. On the other hand, in a case of analyzing a surface form of the two-dimensional cross-sectional structure of a semiconductor, the average roughness of the surface is a value of dividing an area of a portion surrounded by a quadric curve of the surface form and a line in the average level of the surface form by the measured length, as shown in FIG. 2. The cross-sectional structure can be observed by a photograph taken by a TEM or a high-resolution scanning electron microscope (SEM). Further, the cross-sectional structure can be observed by scanning the measuring needle of an AFM or an STM once. In the present invention, when an electron microscope such as an AFM or an STM is used as an analyzing means, the region of measured length for calculating the average roughness is a field of view or plural fields of view of the electron microscope in a magnitude capable of calculating the roughness. When the AFM or the STM is used, the measured length is an arbitrary region of the semiconductor surface having a length longer than an analysis limit length. In the present invention, the method of calculating the average roughness may be used either of the method of calculating from the three-dimensional form or the method of calculating from the cross-sectional form. Letting the average height of the plane be X-Y plane, the longitudinal direction be Z axis, and the curve of the measured surface form be $z=f(x, y)$ when the three-dimensional form is observed, the average roughness Ra can be expressed by the following equation.

$$Ra=(1/(Lx \cdot Ly)) \times \int^{Lx}_0 \int^{Ly}_0 f(x, y)dxdy$$

where Lx is a measured length in the X direction, and Ly is a measured length in the Y direction.

On the other hand, Letting the average height of the line be X axis, the longitudinal direction be Y axis, and the curve of the measured surface form be $y=f(x)$ when the cross-sectional form is observed, the average roughness Ra can be expressed by the following equation.

$$Ra=(1/Lx) \times \int^{Lx}_0 f(x)dx,$$

where Lx is a measured length in the X direction.

Further, from observation of the polycrystalline silicon film in accordance with the present invention by X-ray diffractometry, it was found that the crystal plane of the silicon film was oriented to mainly (1.1.1) plane. The polycrystalline silicon in accordance with the present invention is very useful for an active layer of a thin film transistor and a semiconductor layer of a solar cell because the crystal grain size is as large as 530 nm and the roughness is as even as 2 nm, and accordingly the performance of the thin film transistor or the solar cell can be largely improved by using the polycrystalline silicon.

Figure 3A:
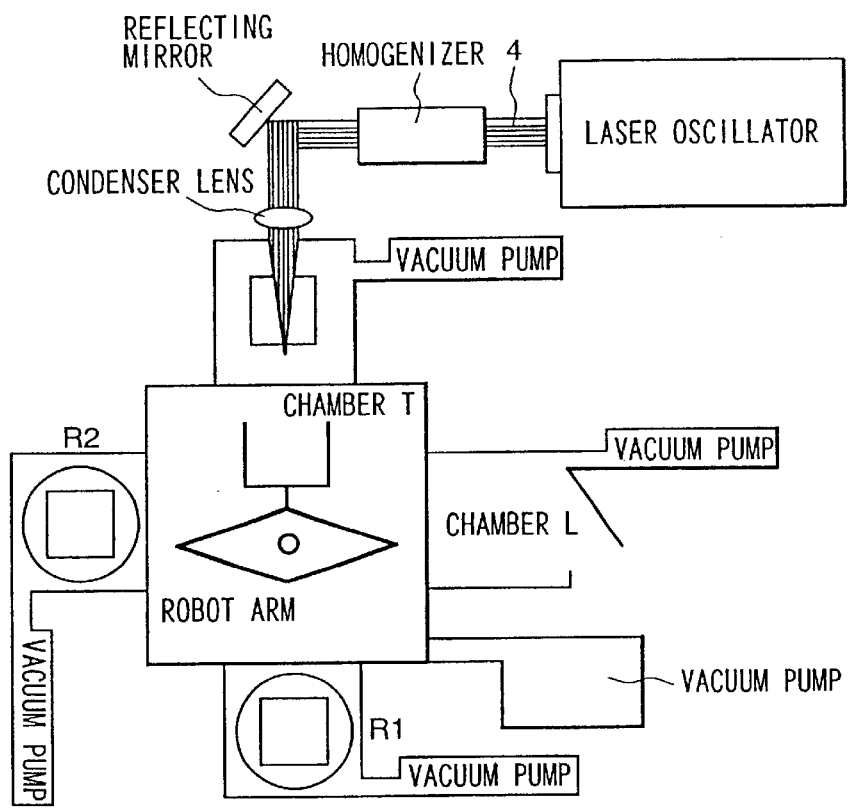
FIG. 3 is schematic views showing a film forming apparatus and a laser crystallizing apparatus used in the fabricating process to which the method of fabricating the polycrystalline silicon thin film in accordance with the present invention is applied.
Figure 3B:
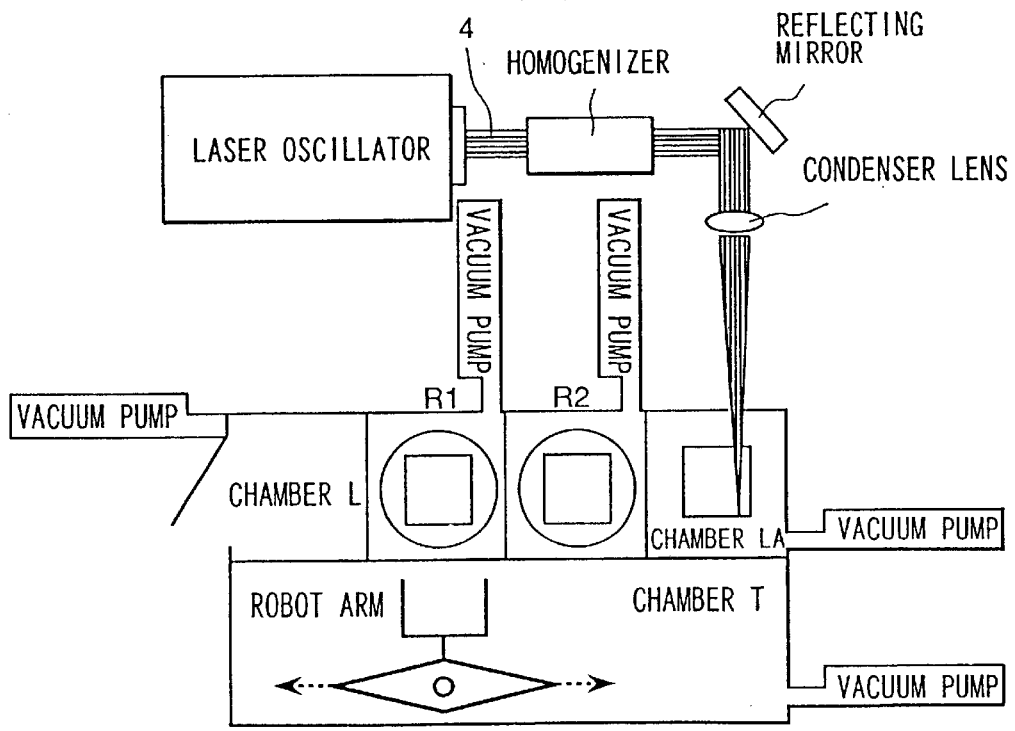

A method of fabricating the polycrystalline silicon film in accordance with the present invention will be described below. As shown in FIG. 3A, in a semiconductor thin film fabricating apparatus used in the present invention, a substrate loading chamber L, an insulation film forming chamber R1, an intrinsic semiconductor film forming chamber R2 and a laser processing chamber LA are arranged so as to surround a transfer chamber T composed of a substrate transfer robot and an evacuating pump, and connected to the transfer chamber T. A substrate can be transferred without being exposed to the atmosphere between each of the film forming chambers and the laser processing chamber through the transfer chamber T of which the vacuum level is maintained higher than 10–5 torr. The polycrystalline silicon film in accordance with the present invention can be fabricated by an apparatus layout that a substrate loading chamber L, an insulation film forming chamber R1, an intrinsic semiconductor film forming chamber R2 and a laser processing chamber LA are arranged in line, and a transfer chamber T composed of a substrate transfer robot and an evacuating pump is arranged along the four chambers, as shown in FIG. 3B.

Figure 4A:
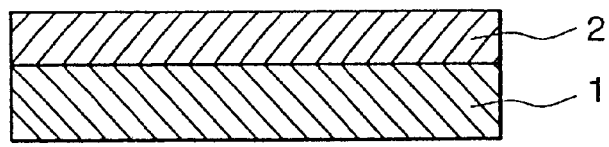
FIG. 4 is a view explaining a fabricating process of polycrystalline silicon in accordance with the present invention.
Figure 4B:
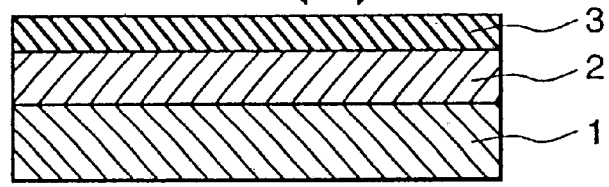
Figure 4C:
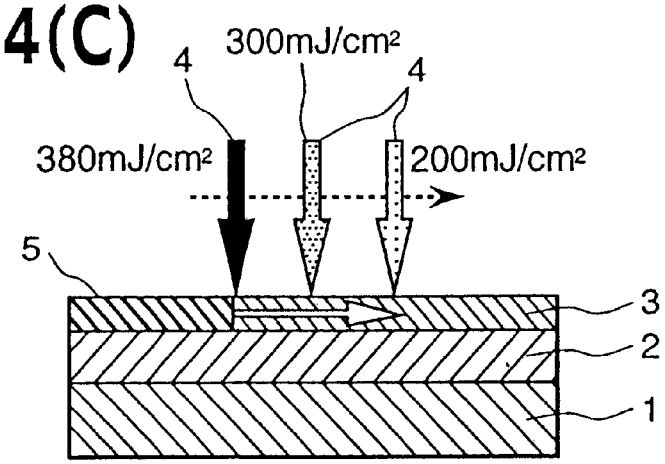
Figure 4D:
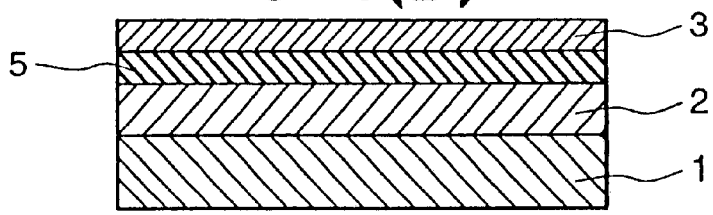
Figure 4E:
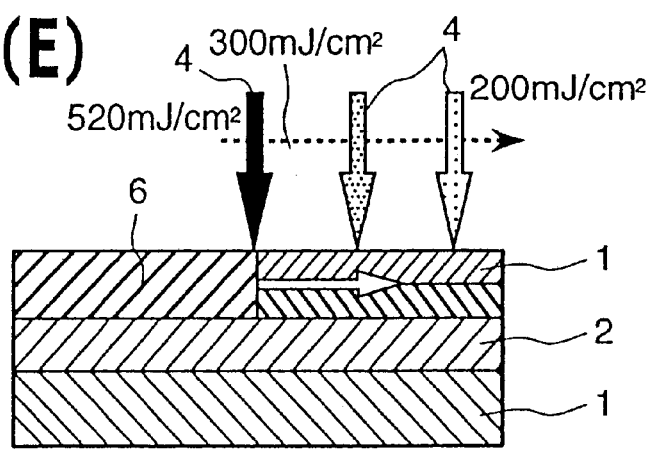

Initially, a base insulation film 2 having a thickness of 300 nm formed of silicon oxide is formed on a glass substrate 1 with keeping the substrate in a temperature below 350° C. through plasma assisted chemical vapor deposition (PECVD) using tetra-ethyl ortho-silicate (TEOS) and oxygen as raw materials, as shown in FIG. 4A. Next, an amorphous silicon film 3 having a thickness of 35 nm and a combined hydrogen concentration in the film of 7% is formed with keeping the substrate in a temperature below 400° C. using mono-silane and hydrogen as raw materials in the intrinsic semiconductor film forming chamber R2, as shown in FIG. 4B. Next, the glass substrate 1 is transferred from the intrinsic semiconductor film forming chamber R2 to the laser processing chamber LA through the transfer chamber T with keeping the vacuum. In the laser processing chamber LA, the substrate temperature is kept at 350° C. using a heater. Then, as shown in FIG. 4C, a polycrystalline silicon 5 is formed by irradiating a Xe—Cl excimer laser beam 4 having a line beam shape by selecting an irradiation pitch so that the preceding laser beam and the following laser beam are overlapped 90% with each other (an irradiation pitch equivalent to performing 10 times of laser irradiation on any position) and increasing the energy density of the laser beam from 200, 300 to 380 mJ/cm$^2$ stepwise. Because the laser is irradiated in multi-steps, the amorphous silicon film 3 is dehydrogenated while the weak energy laser is being irradiated. Therefore, the amorphous silicon film 3 can be crystallized without damaging the film even if the combined hydrogen concentration in the film is above 3%. If the combined hydrogen concentration in the film is below 10%, it is sufficient number of the steps of laser irradiation is three or less. Therefore, the fabrication time can be shortened and accordingly the throughput can be improved. After completion of the laser irradiation, the glass substrate 1 is transferred from the laser processing chamber LA to the intrinsic semiconductor film forming chamber R2 through the transfer chamber T with keeping the vacuum. Then, as shown in FIG. 4D, an amorphous silicon film 3 having a thickness of 25 nm and a combined hydrogen concentration in the film of 7% is formed with keeping the substrate in a temperature below 400° C. using mono-silane and hydrogen as raw materials in the intrinsic semiconductor film forming chamber R2. Next, the glass substrate 1 is transferred from the intrinsic semiconductor film forming chamber R2 to the laser processing chamber LA through the transfer chamber T with keeping the vacuum. Then, as shown in FIG. 4E, a large grain size polycrystalline silicon 6 is formed by irradiating a Xe—Cl excimer laser beam 4 having a line beam shape by selecting an irradiation pitch so that the preceding laser beam and the following laser beam are overlapped 90% with each other and increasing the energy density of the laser beam from 200, 300 to 520 mJ/cm$^2$ stepwise. Thus, fabrication of the polycrystalline silicon is completed. As described above, according to the present invention, it is possible to form a high-quality polycrystalline silicon film having a film thickness 60 nm, an average size of the crystal grains of 530 nm and an average surface roughness of 2 nm on an economical glass substrate. Accordingly, the fabrication cost of the high-quality polycrystalline silicon can be reduced.

The laser crystallization mechanism in the present invention will be described below. The inventors found that a polycrystalline silicon film having an average surface roughness below 5 nm and small projections and an average crystal grain size above 300 nm could be fabricated by irradiating laser light in three steps from low energy to high energy on an amorphous silicon film having a film thickness below 40 nm. This came from the fact that the crystal growth during laser irradiation in the third step was mainly crystal growth of secondary grain growth by melt-combining of crystal grains having a grain size of 100 to 200 nm which had been produced from isotropic growth by melting and solidifying by the laser irradiation up to the second step, and not that the crystal growth during laser irradiation in the third step was crystal growth of melted silicon in the lateral direction which produced the projections. The amorphous silicon 3 of the first layer crystallized first is a film as thin as 35 nm, and the polycrystalline silicon 5 of the first layer having an average roughness in the surface of 5 nm and an average crystal grain size of 400 nm is formed by the laser crystallization method of three step irradiation in accordance with the present invention. When the laser crystallization for the second layer is performed, the film of the first layer is already crystallized to polycrystalline silicon and consequently the melting point becomes higher than that of amorphous silicon. Therefore, the melted zone of the polycrystalline silicon 5 of the first layer during the laser crystallization for second layer is only the vicinity of the boundary zone with the silicon in the second layer. The film thickness of the amorphous silicon in the second layer is 25 nm, and accordingly the silicon melted during the laser crystallization for the second layer is the whole silicon in the second layer and only the very thin zone in the upper layer of the silicon of the first layer. Therefore, the thickness of the silicon melted during the second laser crystallization is thinner than the thickness of the silicon melted during the first laser crystallization. It is considered that the grain size of the semiconductor thin film is likely to grow larger by the secondary grain growth caused by melt-combining with an adjacent crystal grain by plural times of laser irradiation as the thickness of the semiconductor thin film becomes thinner. The theoretical explanation is reported in Applied Physics Letter Vol. 44, No. 6, 19894, p602. The non-melted polycrystalline silicon 5 in the lower layer is heated up to 1000° C. or more by heat conduction by contact with the melted silicon and absorption of the laser light. Since this portion serves as a heat reservoir when the melted silicon in the upper layer is crystallized, the cooling speed is slowed down and accordingly the crystallization speed is decreased to form the large grain sized polycrystalline silicon 6 having an average crystal grain size of 530 nm. This grain size is larger than the average crystal grain size of 210 nm which is obtained from laser-crystallizing a single amorphous silicon layer having a thickness of 60 nm equal to the sum of the thickness of the silicon films of the first layer and the second layer similarly to the conventional method. In order to improve the effect of heat reservoir, it is preferable that the thickness of the silicon of the first layer is set to a value larger than the thickness of the silicon in the second layer. Further, since the secondary grain growth by melt-combining with the adjacent crystal grain occurs when the semiconductor layer is in a high temperature state above 600° C. even if the semiconductor layer is not melted, growth of the crystal grains in the heated polycrystalline silicon of the first layer by the secondary grain growth and the melt-combination between the growing crystal grains of the first layer and the crystal grains under growing by solid crystallization occur at the same time. As the result, in the produced large grain sized polycrystalline silicon 6, at least more than 70% of the crystal grains continuously extend from the interface between the semiconductor layer and a base insulation layer 2 to the semiconductor surface without discontinuity at some midpoint. Therefore, since the ratio of region where the crystal grains overlap in the film-thickness direction is decreased, number of the defects caused by the crystal grain boundaries in the polycrystalline silicon become small and accordingly the characteristic of the semiconductor can be improved. Further, since the mechanism of crystal grain growth in the first and the second layers is the secondary grain growth by melt-combining of the crystal grains, as described above, which is not growth in the lateral direction to produce the projection on the surface, the height of the projection produced during laser crystallization becomes lower than the height of the projection which is obtained from laser-crystallizing a single amorphous silicon layer having a thickness equal to the sum of the thickness of the silicon films of the first layer and the second layer similarly to the conventional method, and consequently it is possible to suppress occurrence of the unevenness on the polycrystalline silicon surface. Furthermore, even if the projections are formed in the polycrystalline silicon of the first layer, the projections are melted first in the polycrystalline silicon of the first layer when the amorphous silicon of the second layer is laser crystallized because the crystal quality of the projections is bad and the melting point is as low as that of amorphous silicon. Therefore, the projections on the surface are suppressed as the whole polycrystalline silicon film to make the surface even. As the result, the average roughness of the surface of the polycrystalline silicon fabricated according to the present invention becomes 2 nm, and the evenness increases applicability of the polycrystalline silicon to various kinds of semiconductor devices such as the thin film transistor and so on as to be described in the following embodiments. The film thickness of the polycrystalline silicon 6 in the above-described embodiment is 60 nm. However, if the film thickness of the polycrystalline silicon 6 is below 40 nm, a small amount of metallic ions and oxygen, nitrogen, carbon impurity contained in the base glass substrate 1 and the base insulator film 2 are diffused to the polycrystalline silicon 6 by heat during laser irradiation to decrease the quality of the film not only in the lower portion but also in the upper portion of the polycrystalline silicon. From this viewpoint, the thickness of 60 nm is preferable. It is advantageous for controlling the film thickness and preferable from the viewpoint of application to a semiconductor device such as a thin film transistor that the film thickness of the polycrystalline silicon 6 is above 40 nm. On the other hand, in regard to the upper limit of the film thickness, the film thickness below 100 nm is preferable from the viewpoint of the property of covering silicon steps of metal or insulation to be deposited on the island-shaped polycrystalline silicon 6 when a semiconductor device such as a thin film transistor or a liquid crystal display apparatus is fabricated. This upper limit is not applied in a case where the polycrystalline silicon is applied to a semiconductor apparatus requiring a thick semiconductor film such as a solar cell or the like. In the present invention, by repeating the set of forming of the amorphous silicon film and crystallizing of the amorphous silicon film by irradiating laser light at least two times, a polycrystalline silicon having a film thickness above 40 nm below 100 nm, an even surface and a large crystal grain size can be easily fabricated. The film thickness of the amorphous silicon of the first layer and the film thickness the amorphous silicon of the second layer are set to 35 nm and 25 nm in the above embodiment, respectively, but are not fixed to these values. If the film thickness of the first layer is thicker than the thickness of the second layer and the total thickness of the first and the second layers is above 40 nm, the values of film thickness may be varied depending on the film quality of each semiconductor and kind of semiconductor apparatus to apply the semiconductor thereto. Since in the present invention the substrate is transferred from the film forming chamber to the laser processing chamber with keeping the vacuum, any concentration peak of silicon oxide does not exist on the surface of the polycrystalline silicon 5 of the first layer at film-forming of the amorphous silicon of the second layer and consequently the characteristic as the polycrystalline silicon is not deteriorated by diffusion of oxygen atoms in the melted silicon during laser crystallizing the amorphous silicon of the second layer. Of course, no concentration peak of oxygen exists in the polycrystalline silicon. In addition, since no silicon oxide layer exists on the surface of the polycrystalline silicon 5 of the second layer and consequently oxygen atoms does not diffuse from the surface to the inside during being melted at the laser crystallization, the characteristic of the polycrystalline silicon can be improved. As described above, according to the present invention, it is possible to form a polycrystalline silicon film having a film thickness above 40 nm, an even surface of an average surface roughness of 2 nm, an average size of the crystal grains above 500 nm and a good semiconductor characteristic with a less oxygen concentration in the film on an economical glass substrate.

Figure 5A:
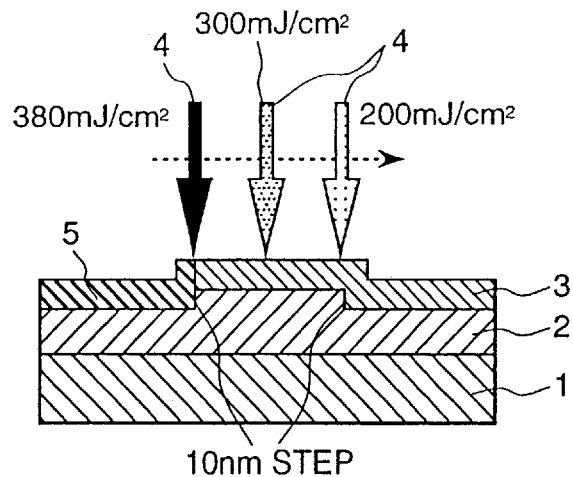
FIG. 5 is a view showing a fabricating process of the semiconductor thin film in which a part of crystal grain boundaries are positioned.
Figure 5B:
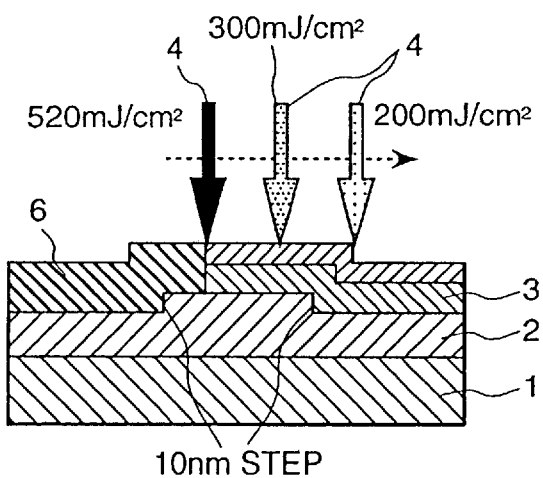
Figure 5C:
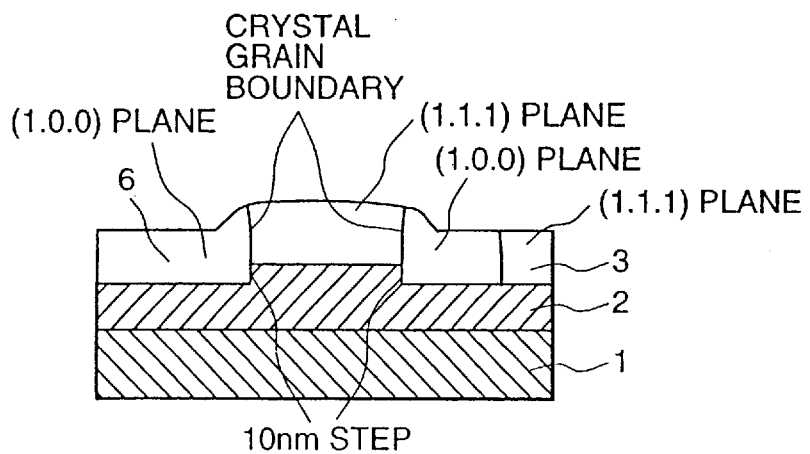

Although in the above embodiment the silicon oxide base film under the silicon film is an even film, the shape of the base film may be patterned through the photo-lithography method and the wet or dry etching method. As shown in FIGS. 5A and 5B, a 10 nm step was provided on a base 2 made of silicon oxide film, and the set of forming of an amorphous silicon film by the PECVD and laser crystallization was repeated twice through the same process as described above. Then, the inventors found that a crystal grain boundary was produced at the step portion as shown in FIG. 5C. Further, it was also found that the crystal grains in contact with the step on the base insulation film located at the lower position of the step were oriented mainly (1, 1, 0) plane or (1, 0, 0) plane. Although the cause of occurrence of these phenomena is unknown, the position producing the crystal grain boundary deteriorating the electric characteristic of the polycrystalline silicon could be controlled by changing the shape of the base insulator film. By doing so, it was possible to obtain a high-quality polycrystalline silicon having an average crystal grain size above 500 nm and an average surface roughness of 2 nm in which at least a part of crystal grain boundaries were positioned.

Figure 6:
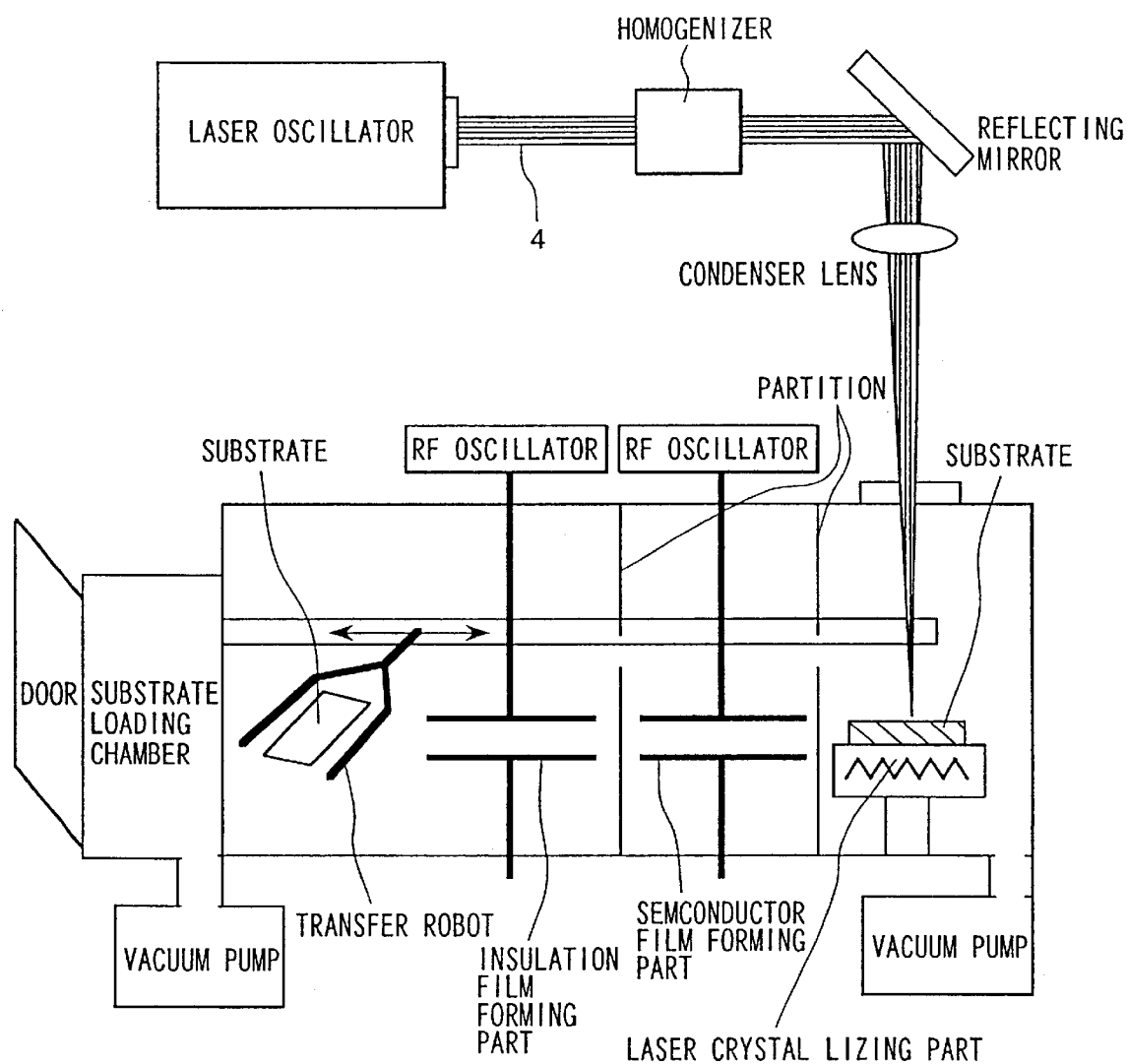
FIG. 6 is a schematic view showing a semiconductor thin film fabricating apparatus of an inline type which is used at the time when the present invention is applied to fabrication of a semiconductor device.

Further, since in the present invention the substrate is heated during laser crystallization, heating time of the substrate after transferred between the laser crystallization process and the semiconductor thin film forming process can be shortened. Therefore, the throughput of the fabrication of the crystalline semiconductor thin film can be improved. Further, since the cooling speed of the semiconductor melted by the laser irradiation can be made slow by heating the substrate during laser crystallization, the crystal grain size of the crystalline semiconductor thin film can be made large and consequently the quality of the crystal can be improved. Although in the present embodiment the film forming temperature of the base insulation film, the film forming temperature of the amorphous silicon and the base temperature during laser crystallization are set to 350° C., 400° C. and 350° C., respectively, it is possible that these temperatures are not fixed and may be varied depending on the film quality of the insulation film or the semiconductor or the performance of the target semiconductor apparatus. However, when a glass substrate is used for the substrate and silicon is used for the semiconductor, these temperatures is preferably set to a value between 200° C. and 500° C. In the apparatus for fabricating the polycrystalline silicon used in the present embodiment, each of the film forming chambers and the laser crystallizing chamber and the substrate loading chamber are connected with the transfer chamber T composed of the substrate transfer robot and the evacuating pump, as shown in FIG. 3. However, the polycrystalline silicon in accordance with the present invention can be fabricated by an in-line type semiconductor fabricating apparatus in which each of film forming parts, a laser crystallizing part and a transfer part are arranged in a single chamber, as shown in FIG. 6. By using the in-line type semiconductor fabricating apparatus which is low in manufacturing cost, spending on equipment can be suppressed and consequently the semiconductor apparatus can be fabricated with low cost. In the present embodiment the substrate is transferred by keeping the transfer system in a high vacuum below $10^{-5}$ torr, However, the substrate may be transferred under an atmosphere of an inert gas such as nitrogen, helium, neon, argon or the like because the present invention requires that the natural oxide film is not formed on the silicon surface after forming the amorphous silicon film or after laser crystallizing the amorphous silicon and the transfer under the atmosphere of an inert gas can attain the same effect as the transfer in a vacuum.

In the above embodiment, the Xe—Cl excimer laser is used for crystallizing the silicon film. However, various kinds of excimer lasers such as a Kr—F excimer laser, an A—F excimer laser or the like, or a continuous-wave laser such as an Ar ion laser the like, or an energy beam such as an electron beam or the like may be used for crystallizing regardless of the kind in principle if it can crystallize the silicon film.

Further, in the above embodiment, the present invention is applied to the amorphous silicon. However, the present invention can be applied to fine-crystalline silicon, polycrystalline silicon, impurity-doped silicon, silicon-germanium (SiGe), germanium (Ge) and so on regardless of the kind of semiconductor if it can be crystallized by heating using laser. Further, in the above embodiment, the film forming apparatus is of the plasma assisted chemical vapor deposition type. However, a low-pressure chemical vapor deposition type (LPCVD), a sputtering type, an ion beam type, an atom bean type, a molecule beam type, a spin-coat type or a vapor deposition type film forming apparatus may be employed regardless of the type if it can be connected to the transfer chamber T and can transfer the substrate between the transfer chamber and the laser processing chamber LA without exposing the substrate to the atmosphere or with keeping a vacuum. Furthermore, in the above embodiment, the substrate used is made of glass. However, a substrate made of an organic resin such as a substrate made of polyimide, polyamide or polyester can be used if the film forming temperatures of the base insulator film 2 and the amorphous silicon 3 are reduced to a value lower than 300° C.

The second embodiment of fabrication of a copalanar type thin film transistor to which the present invention is applied will be described below.

Figure 8:
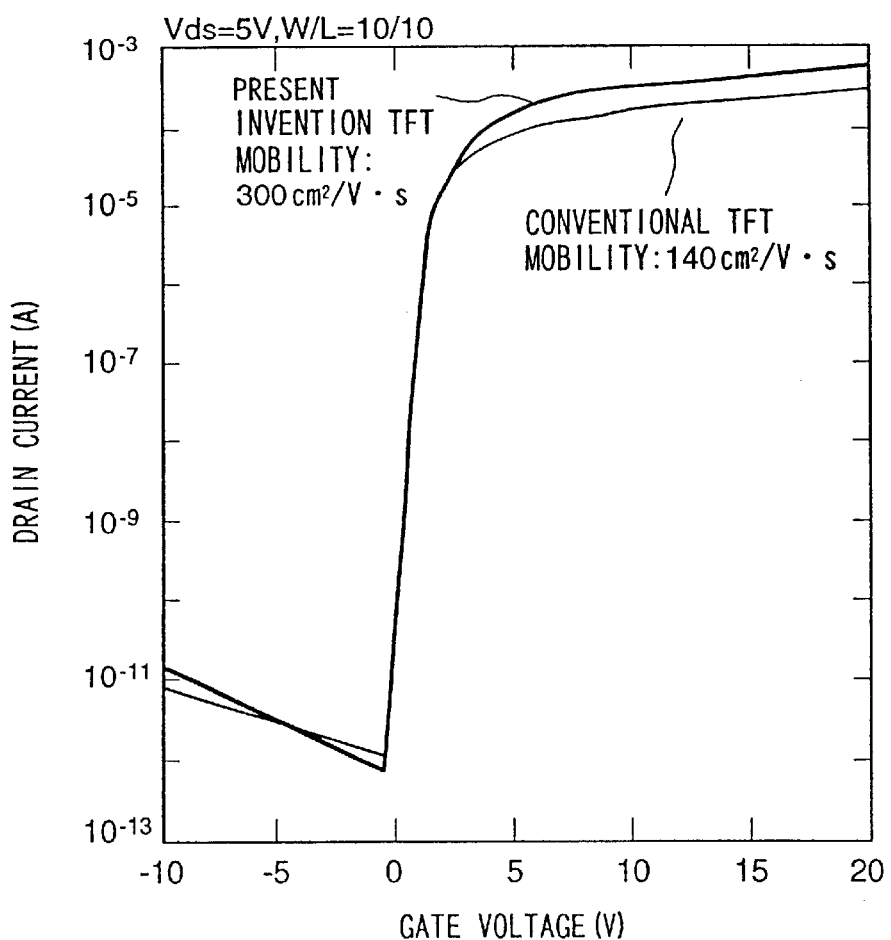
FIG. 8 is a graph comparing the gate voltage versus drain current characteristics of a polycrystalline silicon thin film transistor in accordance with the present invention and a thin film transistor fabricated through a conventional fabricating method.
Figure 7A:
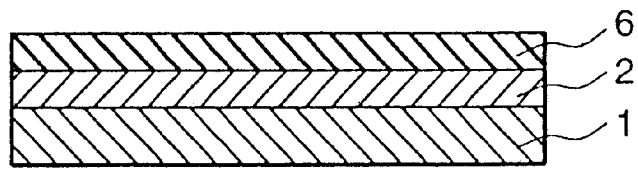
FIG. 7 is a view explaining the fabricating process to which the method of fabricating the polycrystalline silicon thin film in accordance with the present invention is applied.
Figure 7B:
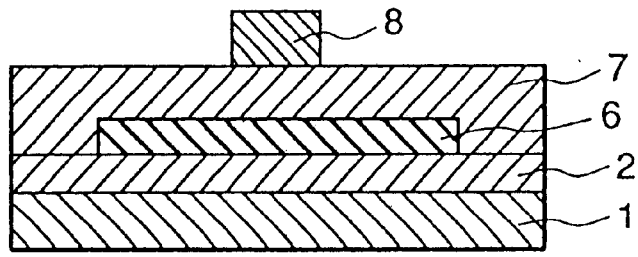
Figure 7C:
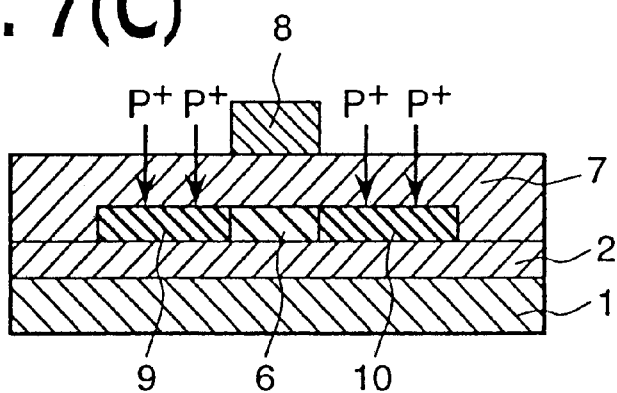
Figure 7D:
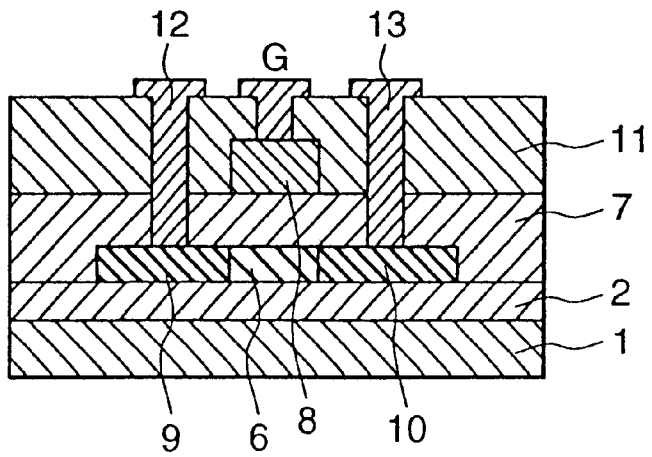

As shown in FIG. 7A, a large grain size polycrystalline silicon 6 to be an active layer of the thin film transistor is formed on a glass substrate 1 having a base insulator film 2 through a method similar to that in the first embodiment. As shown in FIG. 7B, after forming the polycrystalline silicon 6 into an island-shape through the photo-lithographic method and the dry etching method, a gate insulation film 7 having a film thickness of 100 nm through the plasma assisted chemical vapor deposition method using TEOS and oxygen as the raw material. Then, after forming a niobium (Nb) film having a film thickness of 250 nm through the sputtering method, a gate electrode 8 is formed by processing the niobium film through the photo-lithograhic method and the dry etching method. Next, as shown in FIG. 7C, after implanting impurity phosphorus (P) into a region of the active layer not overlapping with the gate electrode 8 through the ion implantation method, a source region 9 and a drain region 10 are formed by activating the impurity by heating the substrate at 500° C. for 2 hours using an electric furnace. Then, as shown in FIG. 7D, after forming an inter-layer insulation film 11 having a film thickness of 500 nm through the plasma assisted chemical vapor deposition method using TEOS and oxygen as the raw material, contact holes are formed through the photo-lithographic method and the dry etching method. Finally, after forming a chromium-molybdenum alloy (Cr—Mo) film having a film thickness of 500 nm through the sputtering method, a gate electrode, a source electrode 12 and a drain electrode 13 are processed through the photo-lithograhic method and the wet etching method. Thus, the thin film transistor is completed. By using the polycrystalline silicon having a large crystal grain size of 530 nm and an average surface roughness of 2 nm for the active layer, it was possible to fabricate a high-performance thin film transistor having a mobility of 300 $cm^2/v·s$ which was largely improved compared to the mobility of 140 $cm^2/v·s$ of a thin film transistor fabricated through the conventional method. FIG. 8 is a graph comparing the gate voltage versus drain current characteristics of a polycrystalline silicon thin film transistor in accordance with the present invention and a thin film transistor having an active layer made of a polycrystalline silicon which is fabricated through the conventional manner that an amorphous silicon film having a film thickness of 60 nm formed through the plasma assisted chemical deposition method is heated at 450° C. under a nitrogen atmosphere to perform dehydrogenating treatment, and then the amorphous silicon is laser crystallized. It is clear from the figure that the ON current in the present invention is increased by the effects of increase in the crystal grain size and decrease in the roughness (projections) of the active layer film. Further, because the electric field concentration in the projection is suppressed by the even surface of the active layer of polycrystalline silicon 6 in accordance with the present invention, the dielectric breakdown voltage of the gate insulator film 7 is largely increased from 4 MV/cm to 7 MV/cm to improve the withstanding voltage characteristic and the reliability to hot carrier is also improved. Furthermore, since the thickness of the gate insulation film can be made thinner, that is, below 80 nm compared to that in the conventional method, the thin film transistor can be driven by a lower voltage and accordingly the power consumption of a semiconductor apparatus using the thin film transistor can be reduced. By using the polycrystalline silicon in accordance with the present invention to an active layer of a thin film transistor, a film thickness of the gate insulation film and a film thickness of the active layer can be set so that a ratio of the film thickness of the gate insulation film to the film thickness of the active layer becomes a value smaller than 8/6. Further, by optimizing the film quality of the gate insulation film, the thickness of the gate insulation film can be made thinner and accordingly the thin film transistor can be driven by a lower consumed power.

Although application of the present invention to the copalanar type thin film transistor has been described in the above embodiment, the present invention can be applied to an inverse stagger type or a normal stagger type thin film transistor regardless of the type of the thin film transistor.

The third embodiment of an active matrix type liquid crystal display apparatus to which the thin film transistors in accordance with the present invention are applied will be described below.

Figure 9:
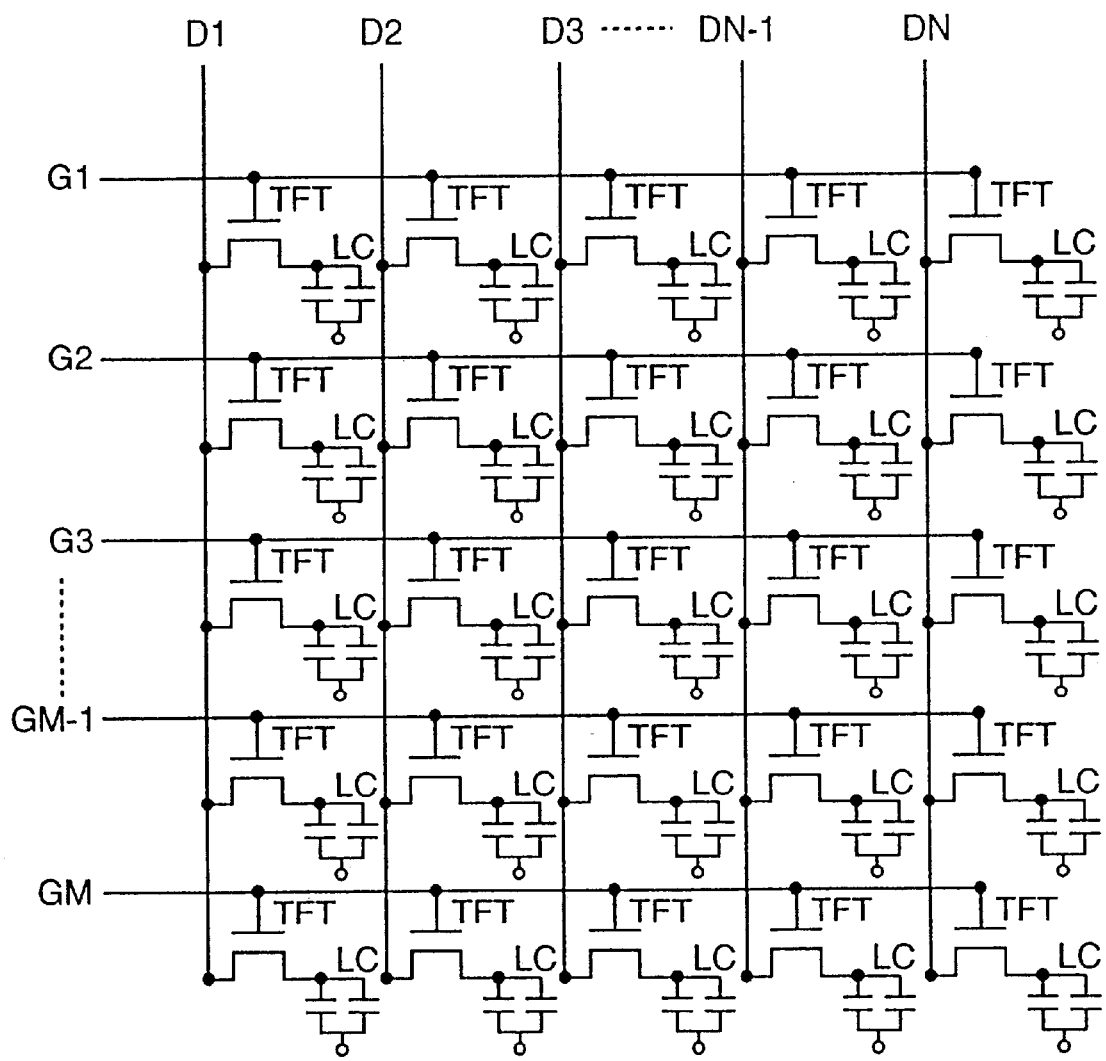
FIG. 9 is a circuit diagram showing the construction of an embodiment of an active matrix type liquid crystal display apparatus in accordance with the present invention.
Figure 10:
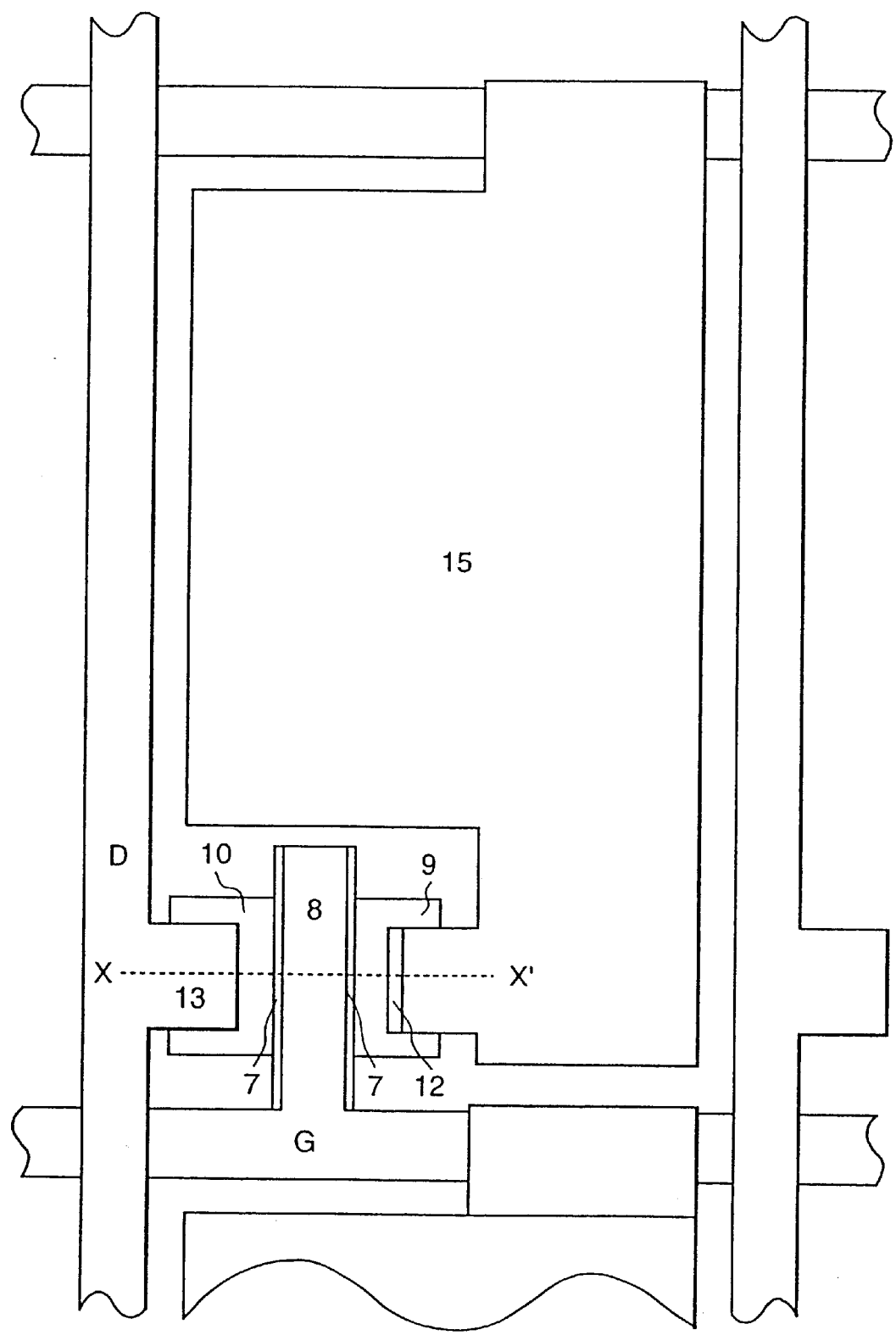
FIG. 10 is a view showing the plane structure of one pixel in an embodiment of an active matrix type liquid crystal display apparatus in accordance with the present invention.
Figure 11:
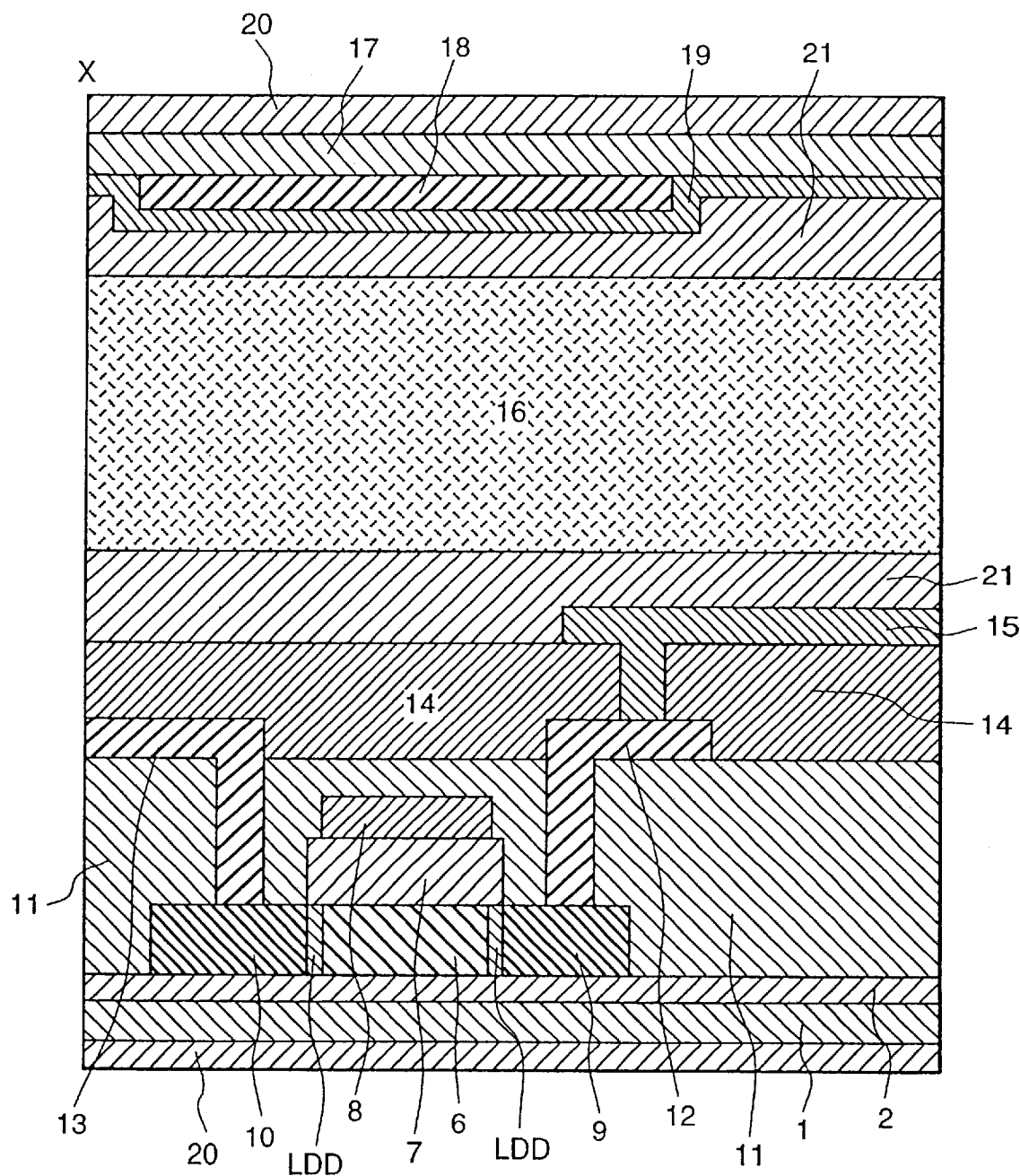
FIG. 11 is a view showing the sectional structure of one pixel in the embodiment of the active matrix type liquid crystal display apparatus in accordance with the present invention.
Figure 13A:
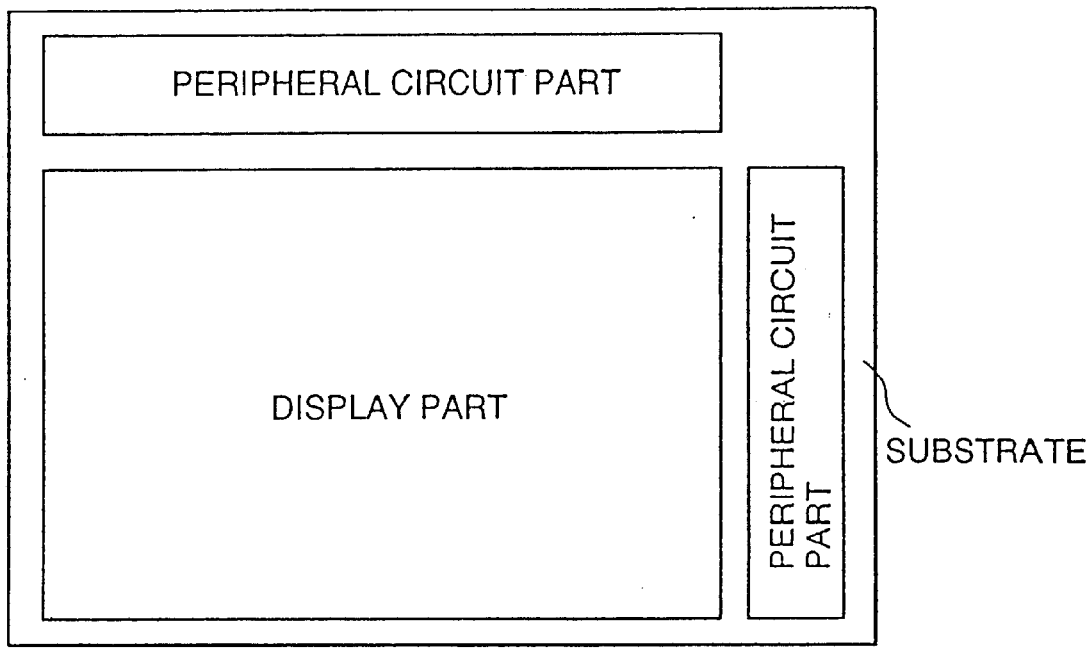
FIG. 13 is views showing the construction of a peripheral circuit containing liquid crystal display apparatus to which the present invention is applied.
Figure 13B:
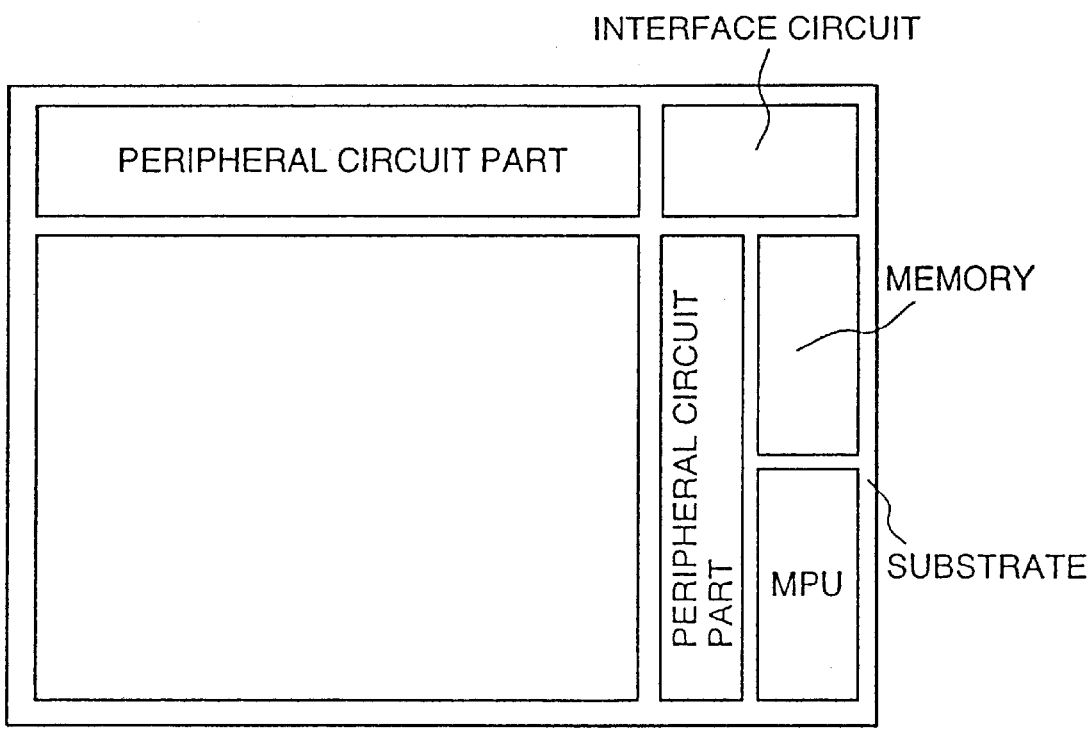
Figure 14A:
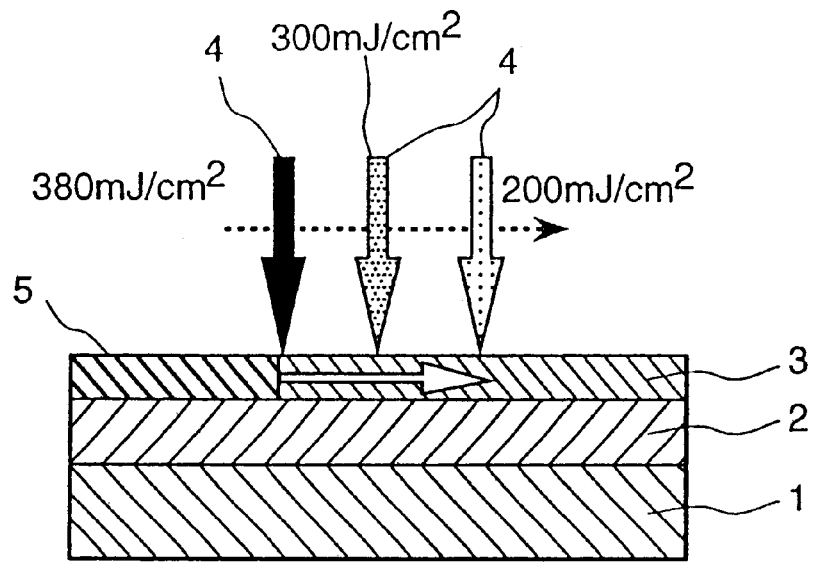
FIG. 14 is a view showing an example of a laser irradiation method in accordance with the present invention.
Figure 14B:
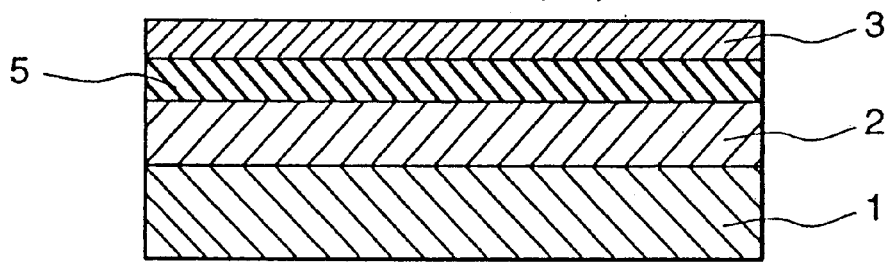
Figure 14C:
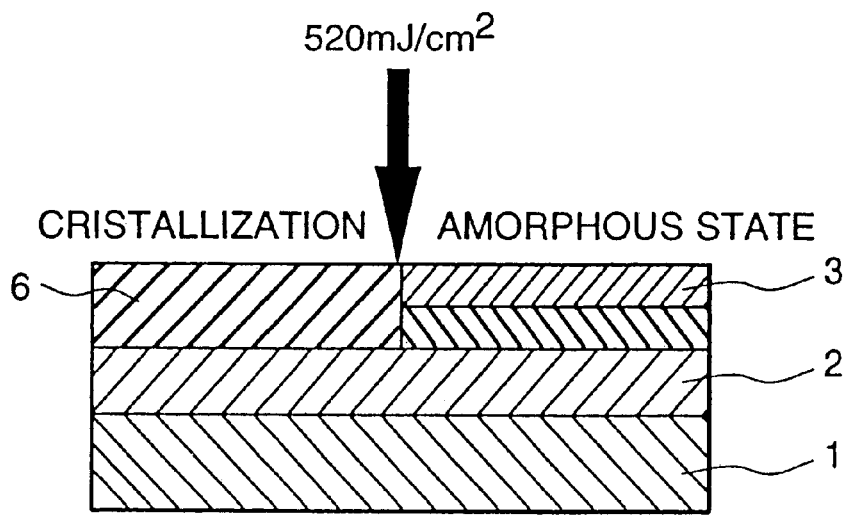
Figure 15A:
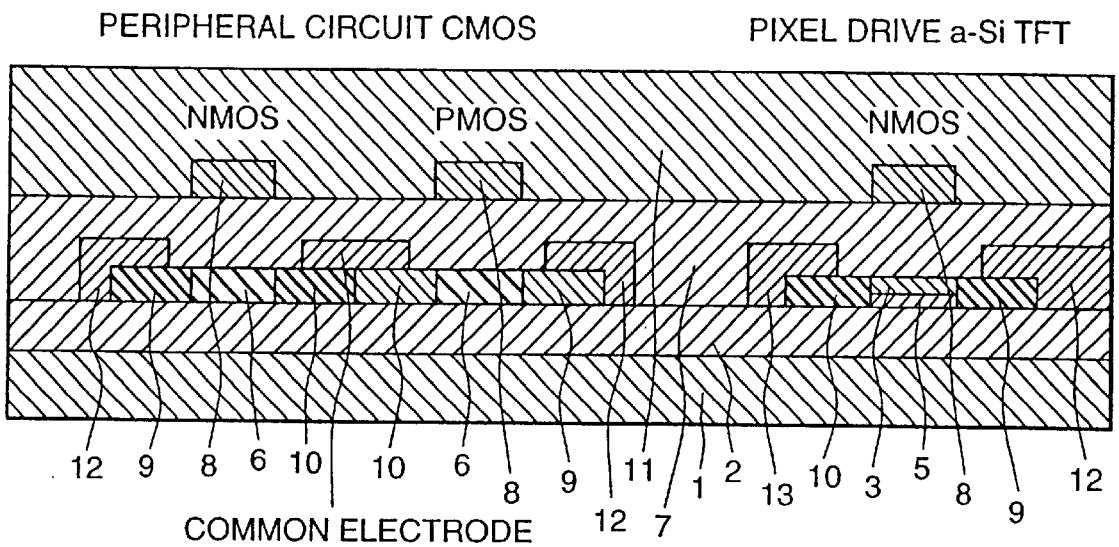
FIG. 15 is views the constructions of embodiments of thin film transistors in peripheral circuit containing liquid crystal display apparatuses to which the present invention is applied.
Figure 15B:
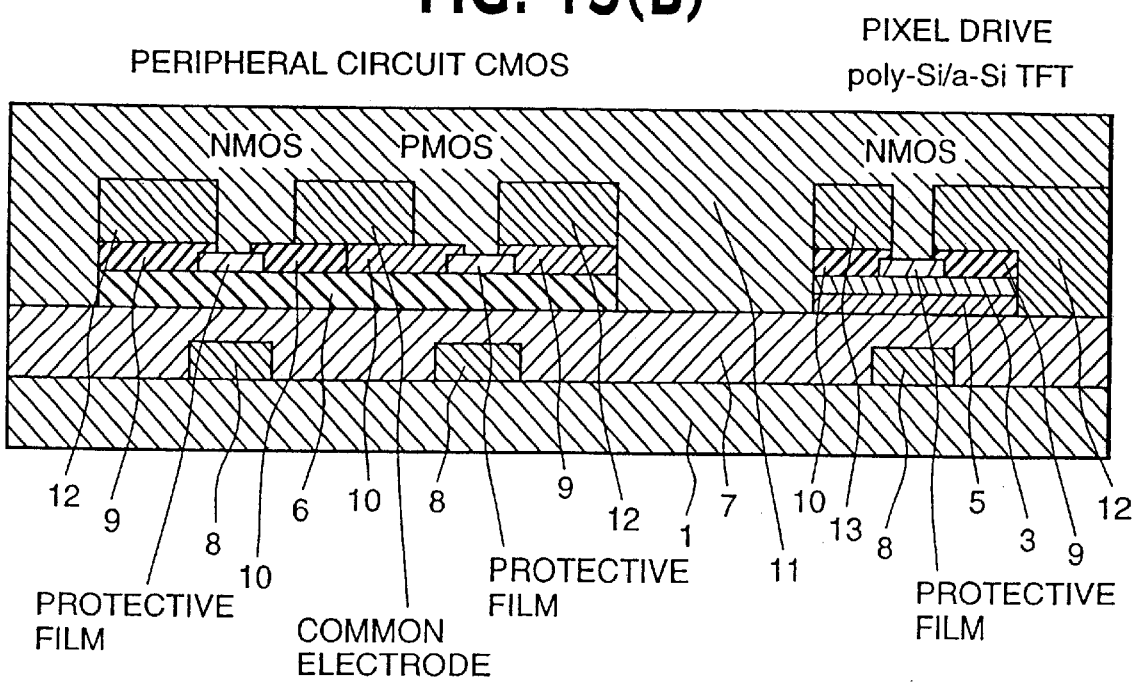

FIG. 9 is a circuit diagram showing the construction of the embodiment of the active matrix type liquid crystal display apparatus in accordance with the present invention. Referring to the figure, a thin film transistor (TFT) is provided in each of a plurality of liquid cells (LC) arranged in a matrix, and each of the liquid cells is driven by switching operation of the TFT. Therein, a gate voltage is sequentially applied to gate lines G1 to GM of electrodes commonly led out from individual gates of the TFTs aligned in the lateral direction on a glass substrate 1 to switch on the gates from gate line to gate line. On the other hand, a data voltage for each of the switched-on gate line is sequentially applied to drain lines D1 to DN of electrodes commonly led out from individual drains of the TFTs aligned in the perpendicular direction to be supplied to each of the liquid cells. FIG. 10 is a view showing the plane structure of one pixel composed of one liquid cell and one TFT. Further, FIG. 11 shows the sectional structure in the dashed line X–X' of FIG. 10. The pixel is composed of the TFT formed near a cross point of the drain wire D and the gate wire G and the liquid cell LC connected to the TFT through a source electrode 12. The sectional structure of the TFT is nearly equal to that of the second embodiment. The structure can be obtained through the fabricating method described in the second embodiment, but points different from the above-described process are as follows. Ion implantation at forming the source-drain region is separately performed twice, and a locally doped drain (LDD) region having a less impurity concentration is provided in the source-drain region in contact with the active layer in order to reduce the OFF current. Further, the gate wire G is formed by processing film-forming and etching together with the gate electrode 8. An inter-layer insulator film 14 made of SiN is formed after forming the source and the drain electrodes 12, 13. After processing this workpiece to bore a contact hole to the source electrode 12, indium-tin oxide film (ITO) is formed and patterned to form a pixel electrode 15. Parts other than the TFT such as liquid crystal will be described below. TN type liquid crystal 16 is filled between the glass substrate 1 having the TFT formed and a glass substrate 17 (an opposite substrate) opposite to the glass substrate 1. A black matrix 18 for cutting off unnecessary light and an opposite electrode 19 made of ITO are formed on the opposite substrate. The liquid crystal is driven by a voltage between the opposite electrode 19 of the opposite substrate 17 and the pixel electrode 15 of the TFT substrate, and an image is displayed on the matrix of the pixels by changing display brightness pixel-by-pixel. A polarizing plate 20 for polarizing light is attached onto each of the glass substrates 1, 17. By orientating polarization axes of these two polarizing plates in orthogonal or parallel to each other, normally black display more or normally white display mode is obtained, respectively. Polarizing films 21 for polarizing the liquid crystal are applied onto the surfaces in contact with the liquid crystal, that is, onto the surface of the interlayer insulation film 14 and the pixel electrode in the glass substrate 1 side and onto the surface of the opposite electrode 19 in the opposite substrate 17 side. After applying the polarizing film, the surface of the polarizing film is processed by the lapping method to add anisotropy for orientating the liquid crystal molecules to the polarizing film. A back light of light source is placed in the substrate 1 side to give brightness to the display. By using the TFTs fabricated as described above in accordance with the present invention for the driving elements of the display part pixels of the active matrix type liquid crystal display apparatus, the TFT can be made small because the grain size of the active layer polycrystalline silicon is large and the mobility is large. Therefore, the opening ratio of the pixel is increased, and accordingly the power of the back light can be reduced by that amount and thus the low power consumption of the liquid crystal display apparatus can be attained. Further, since the surface of the TFT active layer is made even and the projections are eliminated, the thickness of the gate insulation film can be made thinner than 80 nm. Therefore, the TFT can be driven by a low voltage and accordingly the low power consumption of the liquid crystal display apparatus can be attained. Furthermore, since the surface is made even and accordingly the characteristic inside the polycrystalline silicon is made uniform, display defects caused by non-uniformity of the characteristic of the polycrystalline silicon TFT can be eliminated. As shown by the plan view A of FIG. 12 and the cross-sectional view being taken on the plane of the dashed line X–X' of the plan view, in a case where a signal storage capacitor of the pixel is formed by sandwiching a silicon oxide film in the same layer of the gate insulation film with an n-type polycrystalline silicon formed by doping phosphorus into the polycrystalline silicon in the same layer of the polycrystalline silicon 6 of the active layer and the common wire formed of a metallic thin film in the same layer of the gate wire, if the polycrystalline silicon in accordance with the present invention is used, the film thickness of the silicon oxide film can be made thin because the unevenness on the surface is very small and consequently there is no possibility of occurrence of dielectric breakdown caused by electric field concentration at a projection. As a result that the distance between the electrodes, the capacitance of the signal storage capacitor is increased and consequently the area of the electrode can be reduced and the opening ratio of the pixel can be increased. Therefore, the low power consumption of the liquid crystal display apparatus can be attained by reducing the brightness of the back light. Further, by constructing the peripheral circuit for driving the display part using the TFTs in accordance with the present invention as shown in FIG. 13A, a small-frame sized and low-cost liquid crystal display apparatus incorporating a peripheral circuit can be manufactured by eliminating the driver LSI. Further, as shown in FIG. 13B, by incorporating not only the display part driving circuit but also a memory, a micro processing unit (MPU) and another information processing unit formed through micro-processing in the periphery of the display part, an advanced liquid crystal display apparatus can be obtained by adding a communication function and a calculating function to the liquid crystal display apparatus. Furthermore, after crystallizing an amorphous silicon in the first layer as shown in FIG. 14A, an amorphous silicon film 3 in the second layer is formed without exposing the atmosphere as shown in FIG. 14B, and then a part of region of the amorphous silicon 3 in the second layer may be intentionally left in the amorphous state without irradiating laser light on that region as shown in FIG. 14C. Then, as shown in FIG. 15A, in the polycrystalline silicon/amorphous silicon region where the amorphous silicon in the second layer has been not irradiated, a display part is provided to form a copalanar type TFT. In the polycrystalline silicon/polycrystalline silicon region where the amorphous silicon in the second layer has been laser crystallized, a peripheral circuit part is provided to form a copalanar type TFT of CMOS structure for driving the circuit. By doing so, because the active layer of the display part TFT becomes high resistance amorphous silicon, the OFF current is reduced and accordingly there is no need to form the offset structure or the lightly doped drain (LDD) structure which is necessary when the display part TFT is constructed using the polycrystalline silicon TFT. Therefore, number of processes for fabricating the peripheral circuit incorporating liquid crystal display apparatus is reduced by that amount, and consequently the throughput of the fabrication is improved and the cost is reduced. The same effect can be obtained in a case where the TFT structure is of an inverse stagger type because a high resistance amorphous silicon exists between the polycrystalline silicon of the active layer and the source-drain region, as shown in FIG. 15B. Different from the second embodiment, in fabricating the polycrystalline silicon TFT described in FIG. 14 and FIG. 15, when the source-drain region is formed, the impurity activation is performed using laser activation in order to prevent the amorphous region from being deteriorated and not using activation of thermal annealing using an electric furnace.

Figure 16:
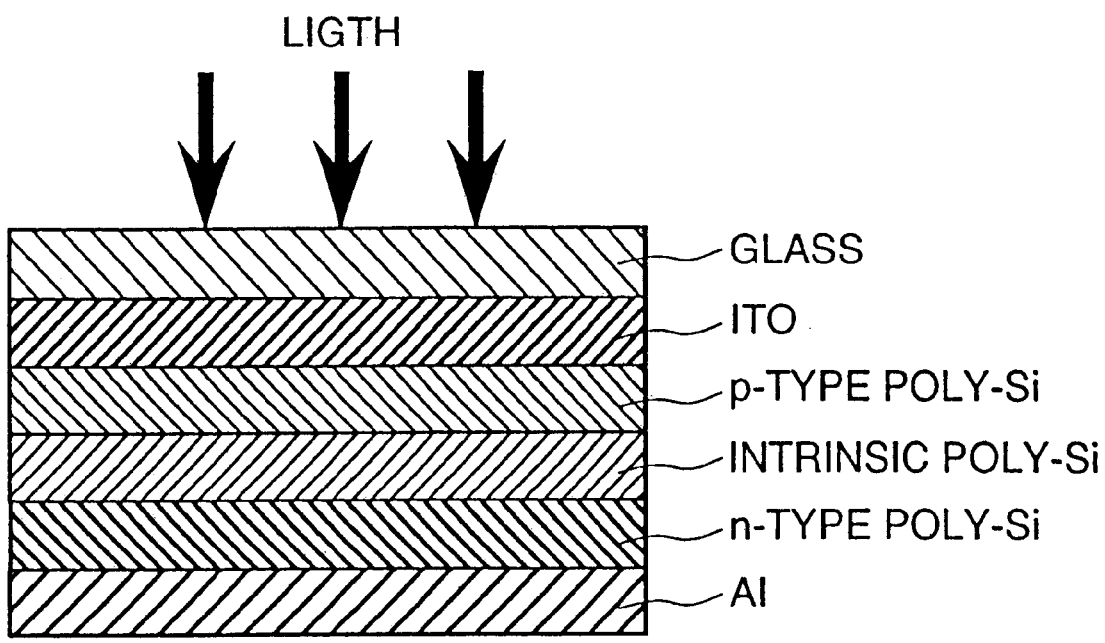
FIG. 16 is a cross-sectional view showing a solar cell to which the present invention is applied.
Figure 17:
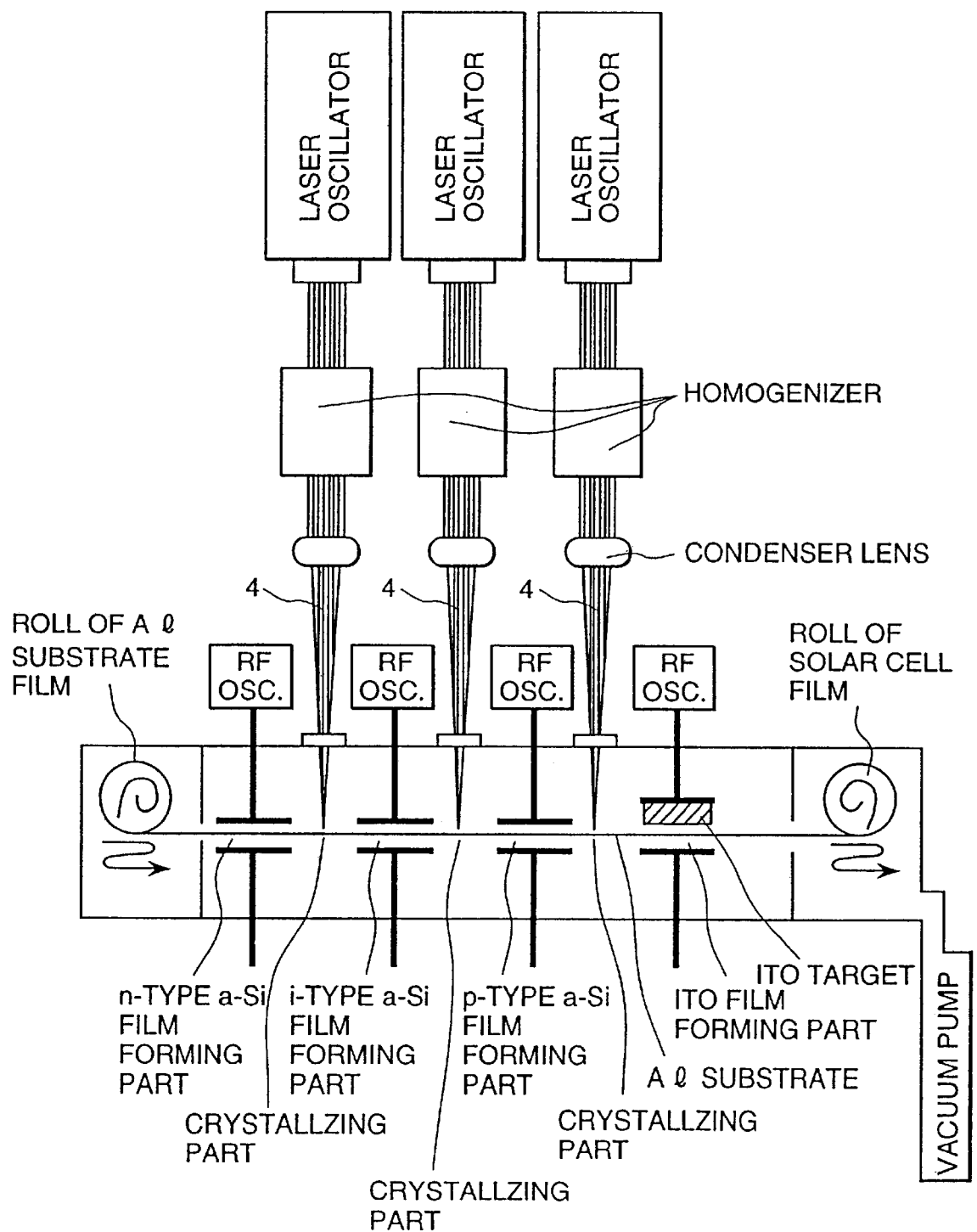
FIG. 17 is a schematic view showing an embodiment of a semiconductor thin film fabricating apparatus used at the time when the present invention is applied to fabrication of a solar cell.

The present invention can be also applied to forming a semiconductor layer in a solar cell which is composed of a p-type, an n-type and an intrinsic polycrystalline silicon layers, as shown in FIG. 16. In the present invention, since the large grain sized and even polycrystalline semiconductor can be fabricated even if the thickness is increased, a solar cell having a high solar light converting efficiency above 15% can be fabricated. The solar cell can be fabricated with the fabricating apparatus shown in FIG. 3 or FIG. 6. However, in a case where the substrate is a long continuous substrate made of stainless steel or aluminum, the solar cell can be fabricated using an inline type fabricating apparatus shown in FIG. 17. By using the inline type fabricating apparatus, the solar cell can be fabricated with low cost. As described above, the present invention can be applied to all the semiconductor apparatuses using the polycrystalline semiconductors in addition to the thin film transistors.

According to the present invention, it is possible to fabricate a high-quality crystalline semiconductor having a film thickness above 40 nm, an average size of the crystal grains larger than 500 nm and an average roughness of the surface smaller than 5 nm on an economical glass substrate. Further, it is possible to improve performance of semiconductor apparatus using the semiconductor such as a thin film transistor, a solar cell and an active matrix type liquid crystal display apparatus.

What is claimed is:

1. A crystalline semiconductor thin film fabricated by a laser crystallizing method, which is formed on a glass substrate, and has a film thickness within a range of 40 nm to 100 nm; an average roughness of the surface smaller than 5 nm; and an average size of the crystal grains larger than 500 nm.

2. A crystalline semiconductor thin film fabricated by a laser crystallizing method, which is formed on a glass substrate, and has a film thickness within a range of 40 nm to 100 nm; an average roughness of the surface smaller than 5 nm; and an average size of the crystal grains larger than 500 nm, wherein when a surface area of an arbitrary crystal grain is expressed by Sn and a circumferential length on the surface of the arbitrary crystal grain is expressed by Ln, at least more than 50% of the crystal grains satisfy the relation $Ln \leq 4\pi Rn$ where $Rn = (Sn/\pi)^{+e,fra\ 12+ee}$.

3. A crystalline semiconductor thin film fabricated by a laser crystallizing method, which is formed on a glass substrate, and has a film thickness within a range of 40 nm to 100 nm; an average roughness of the surface smaller than 5 nm; and an average size of the crystal grains larger than 500 nm, wherein when a surface area of an arbitrary crystal grain is expressed by Sn and a circumferential length on the surface of the arbitrary crystal grain is expressed by Ln, at least more than 50% of the crystal grains satisfy the relation $Ln \leq 4\pi Rn$ where $Rn = (Sn/\pi)^{1/2}$, and further when crystal structures on an arbitrary cross section of the crystalline semiconductor thin film are observed, at least more than 70% of the crystal grains continuously extend from an interface between the semiconductor layer and a base layer to the semiconductor surface without discontinuity at some midpoint.

4. A semiconductor apparatus containing a solar cell, wherein the semiconductor thin film according to any one of claims 1, 2 and 3 is used at least in a first layer in semiconductor layers of the solar cell.

5. A crystalline semiconductor thin film fabricated by a laser crystallizing method, which is formed on a glass substrate, and has a film thickness thicker than 40 nm; an average roughness of the surface smaller than 5 nm; and an average size of the crystal grains larger than 500 nm.

6. A crystalline semiconductor thin film fabricated by a laser crystallizing method, which is formed on a glass substrate, and has a film thickness thicker than 40 nm; an average roughness of the surface smaller than 5 nm; and an average size of the crystal grains larger than 500 nm, wherein when a surface area of an arbitrary crystal grain is expressed by Sn and a circumferential length on the surface of the arbitrary crystal grain is expressed by Ln, at least more than 50% of the crystal grains satisfy the relation $Ln \leq 4\pi Rn$ where $Rn = (Sn/\pi)^{1/2}$.

7. A crystalline semiconductor thin film according to any one of claims 1, 2, 3, 5 and 6, wherein orientation of the semiconductor thin film is mainly (1.1.1) plane.

8. A crystalline semiconductor thin film according to any one of claims 1, 2, 3, 5, and 6, wherein said semiconductor is silicon.

9. A crystalline semiconductor thin film according to any one of claims 1, 2, 3, 5 and 6, wherein at least a part of crystal grain boundaries are positioned, and orientation of the part of crystal grains is mainly (1.0.0) plane or (1.1.0).

10. A crystalline semiconductor thin film according to any one of claims 1, 2, 3, 5 and 6, wherein the glass substrate is made of a no-alkali glass which has a softening point lower than 700° C.

11. A semiconductor apparatus containing a coplanar type or a normal stagger type thin film transistor, wherein the thin film transistor is formed on a glass substrate, and the semiconductor thin film according to any one of claims 1, 2, 3, 5 and 6 is used in an active layer of the thin film transistor, and a film thickness of a gate insulation film of the thin film transistor is thinner than 80 nm or a ratio of the film thickness of the gate insulation film to a film thickness of the active layer is smaller than 8/6.

12. A semiconductor apparatus containing a coplanar type or a normal stagger type thin film transistor, wherein the thin film transistor is formed on a glass substrate, and the semiconductor thin film according to any one of claims 1, 2, 3, 5 and 6 is used in an active layer of the thin film transistor, and a film thickness of a gate insulation film of the thin film transistor is thinner than a film thickness of the active layer.

13. A semiconductor apparatus containing a thin film transistor, wherein the thin film transistor is formed on a glass substrate, and the semiconductor thin film according to any one of claims 5 and 6, is used in an active layer of the thin film transistor.

14. A semiconductor apparatus containing a thin film transistor, wherein the thin film transistor is formed on a glass substrate, and a semiconductor thin film formed in an active layer of the thin film transistor through a laser crystallizing method has a thickness within a range of 40 nm to 100 nm; an average roughness of the surface smaller than 5 nm; and an average size of the crystal grains larger than 500 nm.

15. A semiconductor apparatus containing a thin film transistor, wherein the thin film transistor is formed on a glass substrate, and a semiconductor thin film formed in an active layer of the thin film transistor through a laser crystallizing method has a thickness within a range of 40 nm to 100 nm; an average roughness of the surface smaller than 5 nm; and an average size of the crystal grains larger than 500 nm, wherein when a surface area of an arbitrary crystal grain is expressed by Sn and a circumferential length on the surface of the arbitrary crystal grain is expressed by Ln, at least more than 50% of the crystal grains satisfy the relation $Ln \leq 4\pi Rn$ where $Rn=(Sn/\pi)^{1/2}$.

16. A semiconductor apparatus containing a thin film transistor comprising a semiconductor thin film, wherein the thin film transistor is formed on a glass substrate, and a semiconductor thin film formed in an active layer of the thin film transistor through a laser crystallizing method has a thickness within a range of 40 nm to 100 nm; an average roughness of the surface smaller than 5 nm; and an average size of the crystal grains larger than 500 nm, wherein when a surface area of an arbitrary crystal grain is expressed by Sn and a circumferential length on the surface of the arbitrary crystal grain is expressed by Ln, at least more than 50% of the crystal grains satisfy the relation $Ln \leq 4\pi Rn$ where $Rn=(Sn/\pi)^{1/2}$, and further when crystal structures on an arbitrary cross section of the crystalline semiconductor thin film are observed, at least more than 70% of the crystal grains continuously extend from an interface between the semiconductor layer and a base layer to the semiconductor surface without discontinuity at some midpoint.

17. A semiconductor apparatus containing a thin film transistor according to any one of claims 14, 15 and 16, wherein the glass substrate is made of a no-alkali glass which has a softening point lower than 700° C.

18. A semiconductor apparatus containing an active matrix type liquid crystal display apparatus in which a thin film transistor is used as a drive element in a pixel or a peripheral circuit, wherein a no-alkali glass having a softening point lower than 700° C. is used for a supporting substrate, and the thin film transistor according to claims 14, 15 and 16 is used for the drive element in the pixel or the peripheral circuit of the active matrix type liquid crystal display apparatus.

19. A semiconductor apparatus containing a solar cell, wherein a semiconductor thin film formed at least in a first layer in semiconductor layers of the solar cell through a laser crystallizing method has a thickness thicker than 40 nm; an average roughness of the surface smaller than 5 nm; and an average size of the crystal grains larger than 500 nm.

20. A semiconductor apparatus containing a solar cell, wherein a semiconductor thin film formed at least in a first layer in semiconductor layers of the solar cell through a laser crystallizing method has a thickness thicker than 40 nm; an average roughness of the surface smaller than 5 nm; and an average size of the crystal grains larger than 500 nm, wherein when a surface area of an arbitrary crystal grain is expressed by Sn and a circumferential length on the surface of the arbitrary crystal grain is expressed by Ln, at least more than 50% of the crystal grains satisfy the relation $Ln \leq 4\pi Rn$ where $Rn=(Sn/\pi)^{1/2}$.

21. semiconductor apparatus containing a solar cell, wherein a semiconductor thin film formed at least in a first layer in semiconductor layers of the solar cell through a laser crystallizing method has a thickness thicker than 40 nm; an average roughness of the surface smaller than 5 nm; and an average size of the crystal grains larger than 500 nm, wherein when a surface area of an arbitrary crystal grain is expressed by Sn and a circumferential length on the surface of the arbitrary crystal grain is expressed by Ln, at least more than 50% of the crystal grains satisfy the relation $Ln \leq 4\pi Rn$ where $Rn=(Sn/\pi)^{1/2}$, and further when crystal structures on an arbitrary cross section of the crystalline semiconductor thin film are observed, at least more than 70% of the crystal grains continuously extend from an interface between the semiconductor layer and a base layer to the semiconductor surface without discontinuity at some midpoint.

* * * * *